(12) United States Patent
Kato et al.

(10) Patent No.: US 8,946,709 B2
(45) Date of Patent: Feb. 3, 2015

(54) SEMICONDUCTOR DEVICE

(75) Inventors: Kiyoshi Kato, Atsugi (JP); Shuhei Nagatsuka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 850 days.

(21) Appl. No.: 13/045,873

(22) Filed: Mar. 11, 2011

(65) Prior Publication Data
US 2011/0227074 A1    Sep. 22, 2011

(30) Foreign Application Priority Data

Mar. 19, 2010   (JP) ................................ 2010-064900

(51) Int. Cl.
| | |
|---|---|
| *H01L 27/088* | (2006.01) |
| *H01L 27/06* | (2006.01) |
| *H01L 27/115* | (2006.01) |
| *H01L 27/12* | (2006.01) |
| *H01L 49/02* | (2006.01) |
| *G11C 16/04* | (2006.01) |

(52) U.S. Cl.
CPC ...... *H01L 27/0688* (2013.01); *H01L 27/11521* (2013.01); *H01L 27/11551* (2013.01); *H01L 27/1156* (2013.01); *H01L 27/1225* (2013.01); *H01L 28/60* (2013.01); *G11C 16/0408* (2013.01); *H01L 27/115* (2013.01)
USPC ........................................ 257/57; 257/E27.06

(58) Field of Classification Search
USPC .............................................. 257/57, E27.06
See application file for complete search history.

(56) References Cited

U.S. PATENT DOCUMENTS

| | | | |
|---|---|---|---|
| 4,466,081 | A | 8/1984 | Masuoka |
| 4,633,438 | A | 12/1986 | Kume et al. |

(Continued)

FOREIGN PATENT DOCUMENTS

| | | |
|---|---|---|
| CN | 101339954 A | 1/2009 |
| EP | 0 053 878 | 6/1982 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Marc Armand
(74) *Attorney, Agent, or Firm* — Eric J. Robinson; Robinson Intellectual Property Law Office, P.C.

(57) ABSTRACT

A semiconductor device with a novel structure is provided in which stored data can be held even when power is not supplied and the number of writing is not limited. The semiconductor includes a second transistor and a capacitor over a first transistor. The capacitor includes a source or drain electrode and a gate insulating layer of the second transistor and a capacitor electrode over an insulating layer which covers the second transistor. The gate electrode of the second transistor and the capacitor electrode overlap at least partly with each other with the insulating layer interposed therebetween. By forming the gate electrode of the second transistor and the capacitor electrode using different layers, an integration degree of the semiconductor device can be improved.

13 Claims, 18 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,940,705 A | 8/1999 | Lee et al. |
| 6,127,702 A | 10/2000 | Yamazaki et al. |
| 6,191,442 B1 | 2/2001 | Matsufusa |
| 6,294,274 B1 | 9/2001 | Kawazoe et al. |
| 6,563,174 B2 | 5/2003 | Kawasaki et al. |
| 6,646,300 B2 | 11/2003 | Ishii et al. |
| 6,727,522 B1 | 4/2004 | Kawasaki et al. |
| 6,825,525 B2 | 11/2004 | Ishii et al. |
| 7,009,243 B2 | 3/2006 | Ishii et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 7,956,361 B2 | 6/2011 | Iwasaki |
| 8,154,024 B2 | 4/2012 | Iwasaki |
| 8,415,731 B2 * | 4/2013 | Yamazaki et al. ............ 257/300 |
| 8,455,868 B2 * | 6/2013 | Yamazaki et al. ............ 257/43 |
| 8,742,412 B2 | 6/2014 | Goyal et al. |
| 2001/0046027 A1 | 11/2001 | Tai et al. |
| 2002/0056838 A1 | 5/2002 | Ogawa |
| 2002/0121659 A1 | 9/2002 | Hur |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0008638 A1 | 1/2009 | Kang et al. |
| 2009/0027371 A1 * | 1/2009 | Lin et al. ............ 345/207 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0032668 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |

FOREIGN PATENT DOCUMENTS

| | | |
|---|---|---|
| EP | 0147151 A | 7/1985 |
| EP | 1737044 A | 12/2006 |
| EP | 2226847 A | 9/2010 |
| EP | 2339639 A | 6/2011 |
| JP | 56-162875 A | 12/1981 |
| JP | 57-105889 | 7/1982 |
| JP | 60-130160 A | 7/1985 |
| JP | 60-198861 A | 10/1985 |
| JP | 62-230043 A | 10/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-040772 A | 2/1999 |
| JP | 11-505377 | 5/1999 |
| JP | 2000-044236 A | 2/2000 |
| JP | 2000-150900 A | 5/2000 |
| JP | 2001-053164 A | 2/2001 |
| JP | 2001-053167 A | 2/2001 |
| JP | 2002-076356 A | 3/2002 |
| JP | 2002-093924 A | 3/2002 |
| JP | 2002-094029 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-103918 A | 4/2007 |
| JP | 2009-206508 A | 9/2009 |
| JP | 2010-045263 A | 2/2010 |
| JP | 2010-062547 A | 3/2010 |

(56) References Cited

FOREIGN PATENT DOCUMENTS

| KR | 2010-0019357 A | 2/2010 |
|---|---|---|
| WO | WO-2004/114391 | 12/2004 |
| WO | WO-2007/029844 | 3/2007 |
| WO | WO-2009/096608 | 8/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Apply. Phys. Lett. (Applied Physics Letters), Jun. 26, 2007, vol. 90, No. 26, pp. 262106-1-2624106-3.

Takahashi.M et al., "Theoretical Analysis of IGZO Transparent Amorphous Oxide Semiconductor,", IDW'08: Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7,8,9 and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technolgoy, 2003, vol. 26, pp. 181-184.

Osada.T et al., "15.2: Development of Driver-Integrated Panel using Amorphous In—Ga—Zn—Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08: SID International Symposium of Technical Papers, May 20, 2008, vol. 39, pp. 633-636.

Lee.J et al., "World'S Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem Oleds,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDE '02 : Proceedings of the 9th International Display Worskshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOOLED Back-Plane,", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09: SID International Symposium Digest of Technical Papers, May 31, 2009, pp. 983-985.

Sakata.J et al., "Development of 4.0-in. AMOLED Display With Driver Circuit Using Amorphous In—Ga—Zn—Oxide TFTs,", IDW '09: Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFR,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID

(56) References Cited

OTHER PUBLICATIONS

Digest '09: SID International Symposium Digest of Technical Papers, May 31, 2009, pp. 1110-1112.
Ohara.H et al., "21.3:4.0 in. QVGA AMOLED Display Using In—Ga—Zn—Oxide TFTs With a Novel Passivation Layer,", SID Digest '09: SID International Symposium Digest of Technical Papers, May 31, 2009, pp. 284-287.
Miyasaka.M, "Suftla Flexible Microelectronics on Their Way to Business,", SID Digest '07: SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09: SID International Symposium Digest of Technical Papers, May 31, 2009, pp. 395-398.
Lee.H et al., "Current Status of, Challenges to, and Perspective View of AM-OLED,", IDW '06: Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", Nirim Newsletter, Mar. 1, 1995, vol. 50, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel,YBFE2O4, and YB2FE3O7 Types of Structures for Compounds in the In2O3 and SC2O3—A2O3—BO Systems [A; Fe, Ga, Or Al; B: Mg, Mn, Fe, Ni, Cu, Or Zn] at Temperatures Over 1000°C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 30, 2008, vol. 39, pp. 629-632.
Orita.M et al., "Mechanism of Electrical Conductivity of Transparent InGaZnO4,", Phys. Rev. B. (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B. (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using Castep,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.
Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.
Kim.W et al., "An Experimental High-Density DRAM Cell with a Built-in Gain Stage,", IEEE Journal of Solid-State Circuits, Aug. 1, 1994, vol. 29, No. 8, pp. 978-981.
Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.
Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.
International Search Report (Application No. PCT/JP2011/055169) Dated May 31, 2011.
Written Opinion (Application No. PCT/JP2011/055169) Dated May 31, 2011.
Chinese Office Action (Application No. 201180014594.6) Dated May 30, 2014.

* cited by examiner

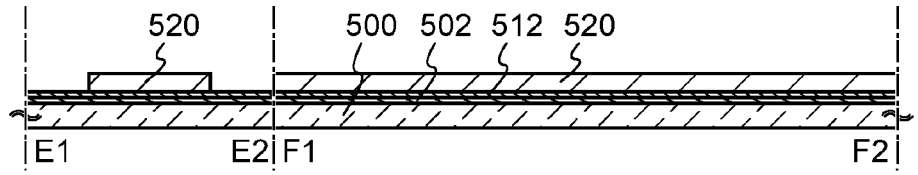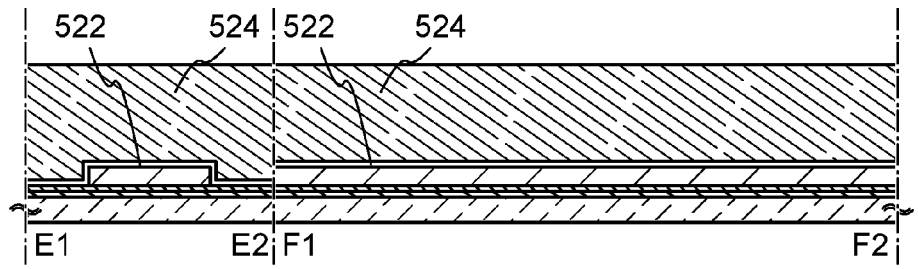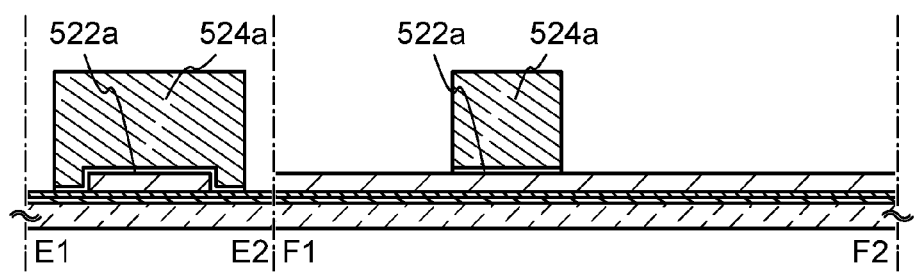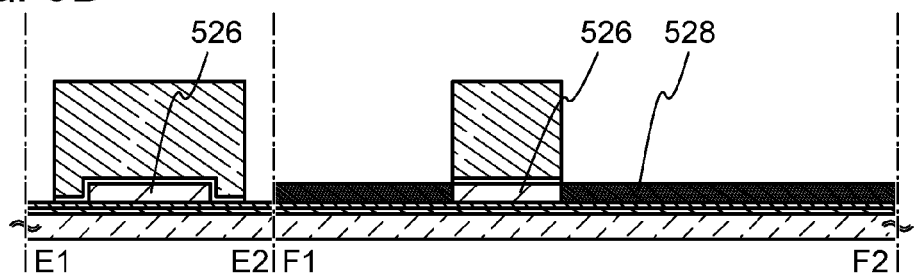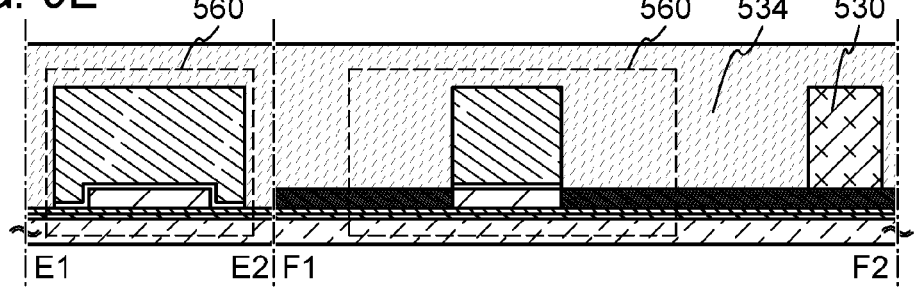

SEMICONDUCTOR DEVICE

TECHNICAL FIELD

The disclosed invention relates to a semiconductor device including a semiconductor element and a manufacturing method thereof.

BACKGROUND ART

Memory devices including semiconductor elements are broadly classified into two categories: a volatile memory device that loses stored data when not powered, and a non-volatile memory device that holds stored data even when not powered.

A typical example of a volatile memory device is a dynamic random access memory (DRAM). A DRAM stores data in such a manner that a transistor included in a memory element is selected and charge is accumulated in a capacitor.

When data is read from a DRAM, charge in a capacitor is lost owing to the above principle; thus, writing is necessary every time data is read out. Moreover, since leakage current (off-state current) flows between a source and a drain of a transistor included in a memory element when the transistor is in an off state, charge flows into or out even when the transistor is not selected, which makes a data holding period short. For that reason, writing operation (refresh operation) is necessary at predetermined intervals, and it is difficult to sufficiently reduce power consumption. Furthermore, since stored data is lost when power supply stops, another memory device utilizing a magnetic material or an optical material is needed in order to hold data for a long time.

Another example of a volatile memory device is a static random access memory (SRAM). An SRAM holds stored data by using a circuit such as a flip-flop and thus does not need refresh operation, which is an advantage over a DRAM. However, cost per memory capacity is increased because a circuit such as a flip-flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary in a volatile memory device is not needed (e.g., see Patent Document 1).

However, in a flash memory, there is a problem in that a memory element becomes unable to function after a predetermined number of writing because a gate insulating layer included in the memory element deteriorates due to tunneling current generated in writing. In order to reduce effects of this problem, a method in which the number of writing is equalized among the memory elements can be employed, for example, but a complex peripheral circuit is needed to employ this method. Moreover, even when such a method is employed, the fundamental problem about the lifetime is not resolved. In other words, a flash memory is not suitable for applications in which data is frequently rewritten.

In addition, high voltage is needed to inject charge in the floating gate or removing the charge, and a circuit therefor is required. Further, it takes a relatively long time to inject or remove charge, and it is not easy to increase the speed of writing and erasing data.

REFERENCE

[Patent Document 1] Japanese Published Patent Application No. S57-105889

DISCLOSURE OF INVENTION

In view of the foregoing problems, an object of one embodiment of the disclosed invention is to provide a semiconductor device with a novel structure in which stored data can be held even when power is not supplied and the number of writing is not limited.

In the disclosed invention, a semiconductor device is formed using a purified oxide semiconductor. A transistor formed using a purified oxide semiconductor can hold data for a long time because leakage current thereof is extremely small.

One embodiment of the present invention includes a plurality of memory cells each including a first transistor, a second transistor, and a capacitor. The first transistor includes a first channel formation region, a first gate insulating layer over the first channel formation region, a first gate electrode which overlaps with the first channel formation region and which is over the first gate insulating layer, and a first source electrode and a first drain electrode electrically connected to the first channel formation region. The second transistor includes a second channel formation region, a second source electrode and a second drain electrode electrically connected to the second channel formation region, a second gate electrode overlapping with the second channel formation region, and a second gate insulating layer between the second channel formation region and the second gate electrode. The capacitor includes the second source electrode or the second drain electrode, an insulating layer covering the second transistor, and a capacitor electrode over the insulating layer. The first channel formation region and the second channel formation region include different semiconductor materials. The first gate electrode and the second source electrode or the second drain electrode are electrically connected to each other. The first transistor and the second transistor overlap at least partly with each other.

In the above structure, the capacitor electrode overlaps with at least part of the second gate electrode with the insulating layer interposed therebetween. In addition, the capacitor electrode overlaps with at least part of the first gate electrode.

In the above structure, the capacitor electrode overlaps with at least part of the second channel formation region.

In the above structure, the first transistor includes impurity regions between which the first channel formation region is sandwiched. In addition, the second channel formation region of the second transistor includes an oxide semiconductor.

In the above structure, the capacitor includes an oxide semiconductor.

Note that in this specification and the like, the term such as "over" or "below" does not necessarily mean that a component is placed "directly over" or "directly below" another component. For example, the expression "a gate electrode over a gate insulating layer" does not exclude the case where a component is provided between the gate insulating layer and the gate electrode.

In addition, in this specification and the like, the term such as "electrode" or "wiring" does not limit a function of a component. For example, an "electrode" is sometimes used as part of a "wiring", and vice versa. Further, the term "electrode" or "wiring" can include the case where a plurality of "electrodes" or "wirings" are formed in an integrated manner.

Further, functions of a "source" and a "drain" are sometimes interchanged with each other when a transistor of opposite polarity is used or when the direction of current flow is changed in circuit operation, for example. Therefore, the terms "source" and "drain" can be interchanged in this specification.

Note that in this specification and the like, the term "electrically connected" includes the case where components are connected through an object having any electric function. There is no particular limitation on the object having any electric function as long as electric signals can be transmitted and received between the components that are connected through the object.

Examples of the object having any electric function include a switching element such as a transistor, a resistor, an inductor, a capacitor, and an element with a variety of functions as well as an electrode and a wiring.

Since the off-state current of a transistor including an oxide semiconductor is extremely small, stored data can be held for a very long period by using the transistor. In other words, refresh operation becomes unnecessary or the frequency of the refresh operation can be extremely low, which leads to a sufficient reduction in power consumption. Moreover, stored data can be held for a long period even when power is not supplied.

Further, a semiconductor device according to one embodiment of the present invention does not need high voltage for writing data, and degradation of the element does not become a problem. For example, unlike a conventional non-volatile memory, it is not necessary to inject and extract electrons into and from a floating gate; thus, a problem such as degradation of a gate insulating layer does not occur at all. That is, the semiconductor device according to one embodiment of the present invention does not have a limit on the number of rewriting, which has been a problem of a conventional non-volatile memory, and thus has significantly improved reliability. Furthermore, since data is written by turning on or off the transistor, high-speed operation can be easily realized. Additionally, there is an advantage in that operation for erasing data is not needed.

Since a transistor including a material which is not an oxide semiconductor can operate at sufficiently high speed, when it is combined with a transistor including an oxide semiconductor, a semiconductor device can perform operation (e.g., reading data) at sufficiently high speed. Further, with a transistor including a material which is not an oxide semiconductor, a variety of circuits (e.g., a logic circuit or a driver circuit) which needs to operate at high speed can be suitably realized.

Thus, a semiconductor device having a novel feature can be realized by provision of both the transistor including a material which is not an oxide semiconductor (and more broadly, a transistor capable of operation at sufficiently high speed) and the transistor including an oxide semiconductor (and more broadly, a transistor whose off-state current is sufficiently small).

Further, in one embodiment of the present invention, a gate electrode of a transistor including an oxide semiconductor material and a capacitor electrode are formed using different conductive layers, and an insulating layer which covers the transistor is formed over the gate electrode. Thus, the distance between the gate electrode and the capacitor electrode can be sufficiently reduced, and these electrodes can partly overlap with each other. Accordingly, a semiconductor device with a higher integration density can be provided.

BRIEF DESCRIPTION OF DRAWINGS

FIGS. 9A to 9E are cross-sectional views illustrating a manufacturing process of a semiconductor device.

BEST MODE FOR CARRYING OUT THE INVENTION

Figure 1A:
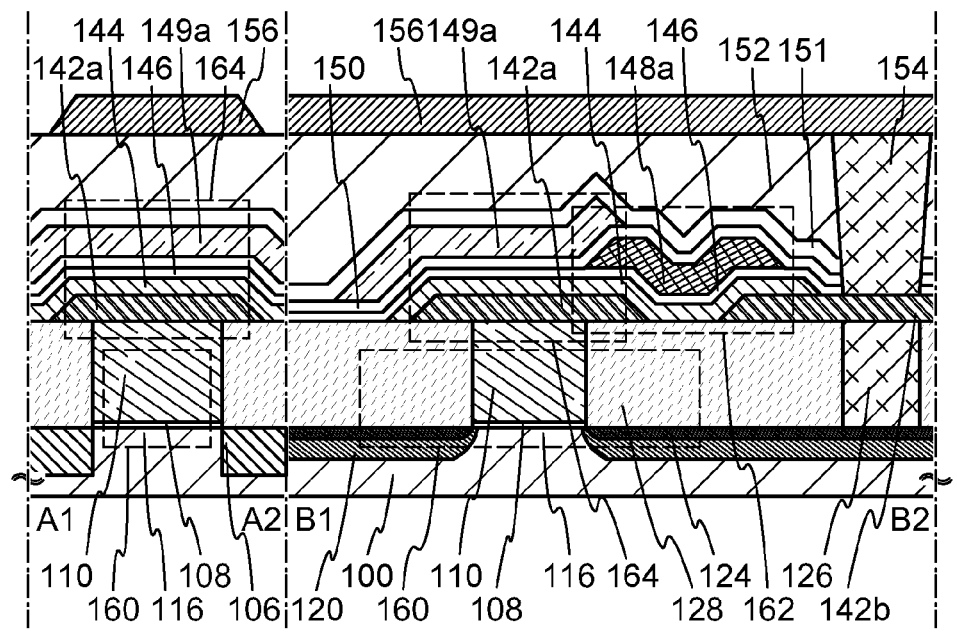
FIGS. 1A and 1B are a cross-sectional view and a plan view of a semiconductor device.

Hereinafter, embodiments of the present invention are described with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description in the following embodiments.

Note that the position, the size, the range, or the like of each structure illustrated in drawings and the like is not accurately represented in some cases for easy understanding. The disclosed invention is thus not necessarily limited by the position, size, range, or the like illustrated in the drawings and the like.

In this specification and the like, ordinal numbers such as first, second, and third are used in order to avoid confusion among components, and the terms do not limit the components numerically.

Embodiment 1

In this embodiment, a structure and a manufacturing method of a semiconductor device according to one embodiment of the present invention will be described with reference to FIGS. 1A and 1B, FIGS. 2A to 2D, FIGS. 3A to 3D, FIGS. 4A to 4D, FIGS. 5A to 5C, and FIGS. 6A and 6B.

<Cross-Sectional Structure and Planar Structure of Semiconductor Device>

Figure 1B:
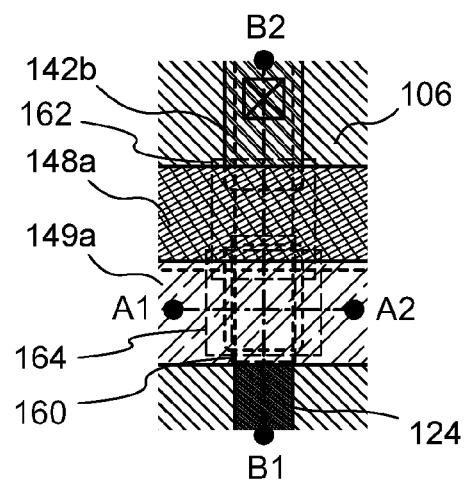

FIGS. 1A and 1B illustrate an example of a structure of a semiconductor device. FIG. 1A is a cross-sectional view of the semiconductor device, and FIG. 1B is a plan view of the semiconductor device. Here, FIG. 1A illustrates a cross section taken along line A1-A2 and line B1-B2 in FIG. 1B. The semiconductor device illustrated in FIGS. 1A and 1B includes a transistor 160 including a first semiconductor material in a lower portion, and a transistor 162 including a second semiconductor material in an upper portion. Here, it is preferable that the first semiconductor material and the second semiconductor material be different from each other. For example, the first semiconductor material can be a semiconductor material which is not an oxide semiconductor and the second semiconductor material can be an oxide semiconductor. The semiconductor material which is not an oxide semiconductor can be, for example, silicon, germanium, silicon germanium, silicon carbide, indium phosphide, or gallium arsenide, and a single crystal semiconductor is preferably used. A transistor including such a semiconductor material can easily operate at high speed. On the other hand, a transistor including an oxide semiconductor can hold charge for a long time owing to its characteristics.

Although both of the transistors are n-channel transistors in this description, it should be appreciated that p-channel transistors can be used. Since the technical feature of the disclosed invention lies in the use of a semiconductor material like an oxide semiconductor, which can sufficiently reduce off-state current, for the transistor 162 in order to hold data, it is not necessary to limit specific conditions such as a structure, material, or the like of the semiconductor device to those given here.

The transistor 160 in FIGS. 1A and 1B includes a channel formation region 116 provided in a substrate 100 including a semiconductor material (e.g., silicon), impurity regions 120 provided so that the channel formation region 116 is sandwiched therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may be referred to as a transistor for the sake of convenience. Further, in such a case, in description of a connection of such a transistor, a source electrode and a drain electrode of the transistor may be described in this specification.

An electrode 126 is connected to part of the metal compound region 124 of the transistor 160. Here, the electrode 126 serves as a source electrode or a drain electrode of the transistor 160. Further, the substrate 100 is provided with an element isolation insulating layer 106 which surrounds the transistor 160. An insulating layer 128 is provided in contact with the transistor 160. Note that in order to increase the degree of integration, it is preferable that the transistor 160 do not include sidewall insulating layers as illustrated in FIGS. 1A and 1B. On the other hand, when the characteristics of the transistor 160 have priority, the sidewall insulating layer may be formed on a side surface of the gate electrode 110 and the impurity region 120 may include a region having a different impurity concentration in a region overlapping with the sidewall insulating layer.

The transistor 162 in FIGS. 1A and 1B includes a source or drain electrode 142a and a source or drain electrode 142b which are provided over the insulating layer 128, an oxide semiconductor layer 144 electrically connected to the source or drain electrode 142a and the source or drain electrode 142b, a gate insulating layer 146 covering the source or drain electrode 142a, the source or drain electrode 142b, and the oxide semiconductor layer 144, and a gate electrode 148a provided over the gate insulating layer 146 so as to overlap with the oxide semiconductor layer 144.

Here, it is preferable that the oxide semiconductor layer 144 be purified by sufficient removal of impurities such as hydrogen and/or sufficient supply of oxygen. Specifically, the hydrogen concentration of the oxide semiconductor layer 144 is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$, for example. Note that the above hydrogen concentration of the oxide semiconductor layer 144 is measured by secondary ion mass spectrometry (SIMS). The carrier concentration of the oxide semiconductor layer 144, in which hydrogen is reduced to a sufficiently low concentration so that the oxide semiconductor layer is purified and in which defect states in an energy gap due to oxygen vacancies are reduced by sufficiently supplying oxygen, is lower than $1\times10^{12}$/cm$^3$, preferably lower than $1\times10^{11}$/cm$^3$, more preferably lower than $1.45\times10^{10}$/cm$^3$. For example, the off-state current (here, current per micrometer (μm) of channel width) at room temperature (25° C.) is smaller than or equal to 100 zA (1 zA (zeptoampere) is $1\times10^{-21}$ A), preferably smaller than or equal to 10 zA. In this manner, with the use of such an i-type (intrinsic) or substantially i-type oxide semiconductor, the transistor 162 which has significantly excellent off-state current characteristics can be obtained.

A capacitor 164 in FIGS. 1A and 1B includes the source or drain electrode 142a, the oxide semiconductor layer 144, the gate insulating layer 146, an insulating layer 150, and an electrode 149a. In other words, the source or drain electrode 142a serves as one electrode of the capacitor 164 and the electrode 149a serves as the other electrode of the capacitor 164.

In the capacitor 164 in FIGS. 1A and 1B, the oxide semiconductor layer 144, the gate insulating layer 146, and the insulating layer 150 are stacked, whereby insulation between the source or drain electrode 142a and the electrode 149a can be sufficiently ensured. Note that in order to provide sufficient capacitance, one of the gate insulating layer 146 and the insulating layer 150 may be omitted in the capacitor 164. Further, the oxide semiconductor layer 144 in the capacitor 164 may be omitted.

In this embodiment, the transistor 160 and the transistor 162 are provided to overlap with each other at least partly. In addition, the transistor 162 and the capacitor 164 are provided to overlap with the transistor 160. For example, the electrode 149a of the capacitor 164 is provided to overlap with at least part of the gate electrode 148a of the transistor 162. Further, the electrode 149a of the capacitor 164 may be provided to overlap with at least part of the gate electrode 110 of the transistor 160. Such a planar layout allows higher integration. For example, when the minimum feature size is F, the area occupied by a memory cell can be 9 F$^2$ to 25 F$^2$. Note that this planar layout is realized by forming the gate electrode 148a of the transistor 162 and the electrode 149a of the capacitor 164 using different conductive layers, and by providing the insulating layer 150 which covers the transistor 162 over the gate electrode 148a. When the gate electrode 148a and the electrode 149a are formed using one conductive layer, it will be difficult to sufficiently reduce the distance between these electrodes because of the formation process constraint. In contrast, when the gate electrode 148a and the electrode 149a are formed using different conductive layers, the distance between these electrodes can be sufficiently reduced, and the electrodes can even partly overlap with each other, which leads to higher integration.

Note that in the transistor 162 and the capacitor 164, the source or drain electrode 142a and the source or drain electrode 142b preferably have tapered end portion. When the end portions of the source or drain electrode 142a and the source or drain electrode 142b are tapered, the coverage with the oxide semiconductor layer 144 can be improved and a break due to a step can be prevented. Here, the taper angle is 30° to 60°, for example. Note that the taper angle refers to an angle formed between the side surface and the bottom surface of a layer having a tapered shape (e.g., the source or drain electrode 142a) when the layer is seen in a direction perpendicular to a cross-sectional plane (i.e., the plane perpendicular to the surface of a substrate).

The insulating layer 150 is provided to cover the gate electrode 148a, an insulating layer 151 is provided over the transistor 162 and the capacitor 164, and an insulating layer 152 is provided over the insulating layer 151. An electrode 154 is provided in an opening formed in the gate insulating layer 146, the insulating layer 150, the insulating layer 151, the insulating layer 152, and the like, and a wiring 156 is formed over the insulating layer 152 to be connected to the electrode 154. Note that although the metal compound region 124, the source or drain electrode 142b, and the wiring 156 are connected to one another through the electrode 126 and the electrode 154 in FIGS. 1A and 1B, the disclosed invention is not limited thereto. For example, the source or drain electrode 142b may be in direct contact with the metal compound region 124, or the wiring 156 may be in direct contact with the source or drain electrode 142b.

Note that in FIGS. 1A and 1B, the electrode 126 for connecting the metal compound region 124 to the source or drain electrode 142b and the electrode 154 for connecting the source or drain electrode 142b to the wiring 156 overlap with each other. In other words, a region in which the electrode 126 serving as a source electrode or a drain electrode of the transistor 160 is in contact with the source or drain electrode 142b of the transistor 162 overlaps with a region in which the source or drain electrode 142b of the transistor 162 is in contact with the wiring 156 for connecting one memory cell to another memory cell. Such a layout allows higher integration.

<Method for Manufacturing Semiconductor Device>

Next, an example of a method for manufacturing the semiconductor device will be described. First, a method for manufacturing the transistor 160 in the lower portion will be described below with reference to FIGS. 2A to 2D and FIGS. 3A to 3D, and then a method for manufacturing the transistor 162 and the capacitor 164 in the upper portion will be described with reference to FIGS. 4A to 4D and FIGS. 5A to 5C.

<Method for Manufacturing Transistor in Lower Portion>

Figure 2A:
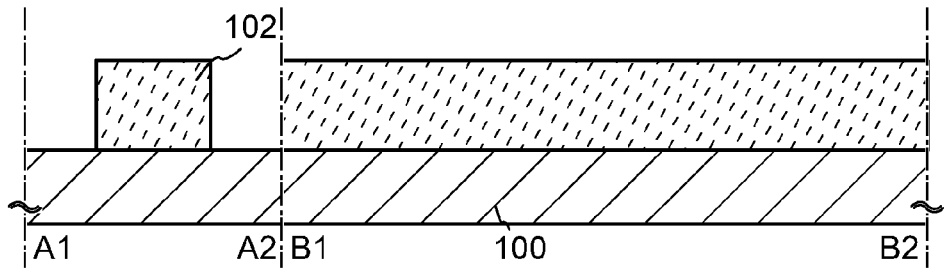
FIGS. 2A to 2D are cross-sectional views illustrating a manufacturing process of a semiconductor device.
Figure 2B:
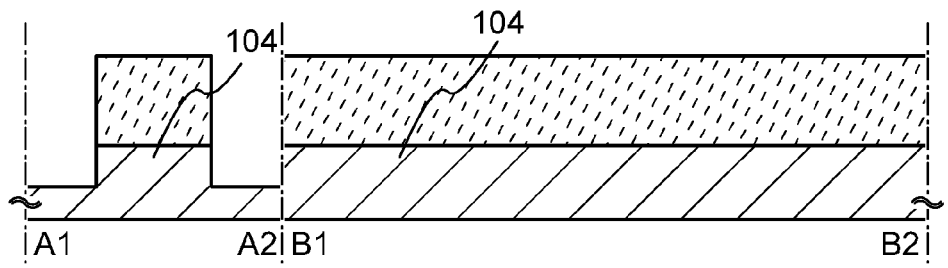

First, the substrate 100 including a semiconductor material is prepared (see FIG. 2A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example where a single crystal silicon substrate is used as the substrate 100 including a semiconductor material is described. Note that although the term "SOI substrate" generally means a substrate in which a silicon semiconductor layer is provided on an insulating surface, the term "SOI substrate" in this specification and the like also includes a substrate in which a semiconductor layer including a material which is not silicon is provided on an insulating surface. That is, the semiconductor layer included in the "SOI substrate" is not limited to a silicon semiconductor layer. Moreover, the SOI substrate also includes a substrate having a structure where a semiconductor layer is provided over an insulating substrate such as a glass substrate with an insulating layer interposed therebetween.

Note that it is particularly preferable that a single crystal semiconductor substrate made of silicon or the like be used as the substrate 100 including a semiconductor material because the speed of reading operation of the semiconductor device can be increased.

A protective layer 102 serving as a mask for forming an element isolation insulating layer is formed over the substrate 100 (see FIG. 2A). As the protective layer 102, an insulating layer formed using a material such as silicon oxide, silicon nitride, or silicon oxynitride can be used, for example. Note that before or after this step, an impurity element imparting n-type conductivity or p-type conductivity may be added to the substrate 100 in order to control the threshold voltage of the transistor. When the semiconductor material included in the substrate 100 is silicon, phosphorus, arsenic, or the like can be used as the impurity imparting n-type conductivity, and boron, aluminum, gallium, or the like can be used as the impurity imparting p-type conductivity.

Then, part of the substrate 100 in a region that is not covered with the protective layer 102 (in an exposed region) is removed by etching using the protective layer 102 as a mask. Thus, a semiconductor region 104 isolated from the other semiconductor regions is formed (see FIG. 2B). As the etching, dry etching is preferably performed, but wet etching may be performed. An etching gas and an etchant can be selected as appropriate in accordance with a material to be etched.

Figure 2C:
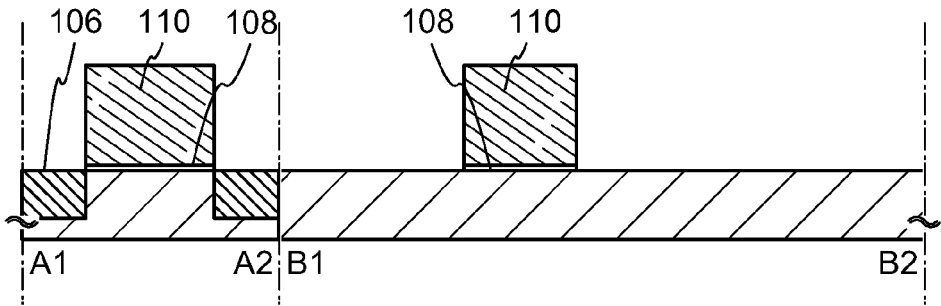

Then, an insulating layer is formed to cover the semiconductor region 104, and the insulating layer in a region overlapping with the semiconductor region 104 is selectively removed, whereby the element isolation insulating layer 106 is formed (see FIG. 2C). The insulating layer is formed using silicon oxide, silicon nitride, silicon oxynitride, or the like. As a method for removing the insulating layer, any of etching treatment, polishing treatment such as chemical mechanical polishing (CMP), and the like can be employed. Note that the protective layer 102 is removed after the formation of the semiconductor region 104 or after the formation of the element isolation insulating layers 106.

The CMP treatment is a method for planarizing a surface of an object to be processed by a combination of chemical and mechanical actions. More specifically, the CMP treatment is a method in which a polishing cloth is attached to a polishing stage, the polishing stage and an object are each rotated or oscillated while a slurry (an abrasive) is supplied between the object and the polishing cloth, so that the surface of the object is polished by a chemical reaction between the slurry and the surface of the object and by a mechanical polishing action between the polishing cloth and the surface of the object.

Note that the element isolation insulating layer 106 may be formed by, instead of selectively removing an insulating layer, implanting oxygen to form an insulating region, for example.

Then, an insulating layer is formed on a surface of the semiconductor region 104, and a layer including a conductive material is formed over the insulating layer.

The insulating layer is to be processed into a gate insulating layer later and can be formed by heat treatment (thermal oxidation treatment, thermal nitridation treatment, or the like) on the surface of the semiconductor region 104, for example.

High-density plasma treatment may be employed instead of heat treatment. The high-density plasma treatment can be performed using, for example, a mixed gas of any of a rare gas such as helium (He), argon (Ar), krypton (Kr), or xenon (Xe), oxygen, nitrogen oxide, ammonia, nitrogen, hydrogen, and the like. Needless to say, the insulating layer may be formed by a CVD method, a sputtering method, or the like. The insulating layer preferably has a single-layer structure or a stacked-layer structure which includes film including gallium oxide, silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), and the like. The insulating layer can have a thickness of, for example, 1 nm to 100 nm inclusive, preferably 10 nm to 50 nm inclusive.

The layer including a conductive material can be formed using a metal material such as aluminum, copper, titanium, tantalum, or tungsten. Further, the layer including a conductive material may be formed using a semiconductor material such as polycrystalline silicon. There is no particular limitation on the method for forming the layer including a conductive material, and any of a variety of film formation methods such as an evaporation method, a CVD method, a sputtering method, and a spin coating method can be employed. Note that in this embodiment, an example where the layer including a conductive material is formed using a metal material is described.

After that, the insulating layer and the layer including a conductive material are selectively etched, whereby the gate insulating layer 108 and the gate electrode 110 are formed (see FIG. 2C).

Figure 2D:
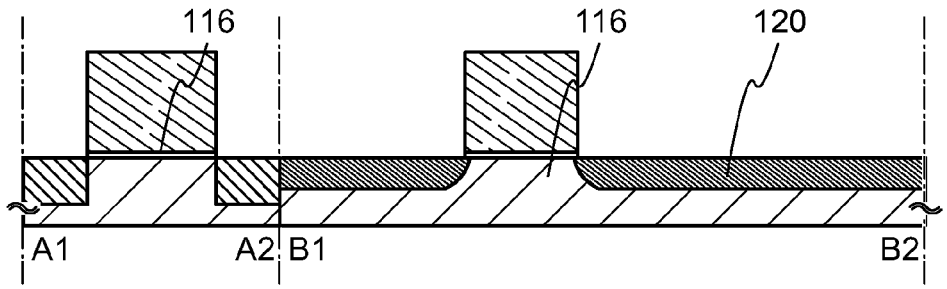

Then, phosphorus (P), arsenic (As), or the like is added to the semiconductor region 104, whereby the channel formation region 116 and the impurity region 120 are formed (see FIG. 2D). Note that phosphorus or arsenic is added here in order to form an n-channel transistor; an impurity element such as boron (B) or aluminum (Al) may be added when a p-channel transistor is formed. Here, the concentration of the impurity added can be set as appropriate; the concentration is preferably set high when a semiconductor element is highly miniaturized.

Note that a sidewall insulating layer may be formed around the gate electrode 110 and an impurity region to which an impurity element is added at a different concentration may be formed.

Figure 3A:
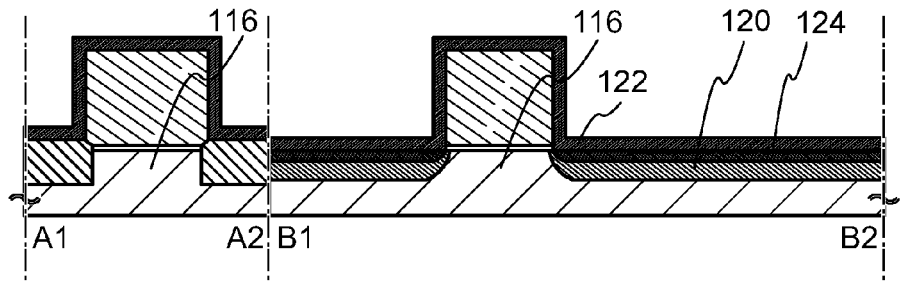
FIGS. 3A to 3D are cross-sectional views illustrating a manufacturing process of a semiconductor device.

Then, a metal layer 122 is formed to cover the gate electrode 110, the impurity region 120, and the like (see FIG. 3A). The metal layer 122 can be formed by a variety of film formation methods such as a vacuum evaporation method, a sputtering method, and a spin coating method. It is preferable that the metal layer 122 be formed using a metal material that reacts with a semiconductor material included in the semiconductor region 104 to form a low-resistance metal compound. Examples of such a metal material include titanium, tantalum, tungsten, nickel, cobalt, and platinum.

Then, heat treatment is performed so that the metal layer 122 reacts with the semiconductor material. Thus, the metal compound regions 124 that are in contact with the impurity regions 120 are formed (see FIG. 3A). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it should be appreciated that another heat treatment method may be used, a method by which the heat treatment can be achieved in an extremely short time is preferably used in order to improve the control of chemical reaction for formation of the metal compound. Note that the metal compound regions are formed by reaction of the metal material and the semiconductor material and the metal compound regions have sufficiently high conductivity. The formation of the metal compound regions can sufficiently reduce the electric resistance and improve element characteristics. Note that the metal layer 122 is removed after the metal compound regions 124 are formed.

Figure 3B:
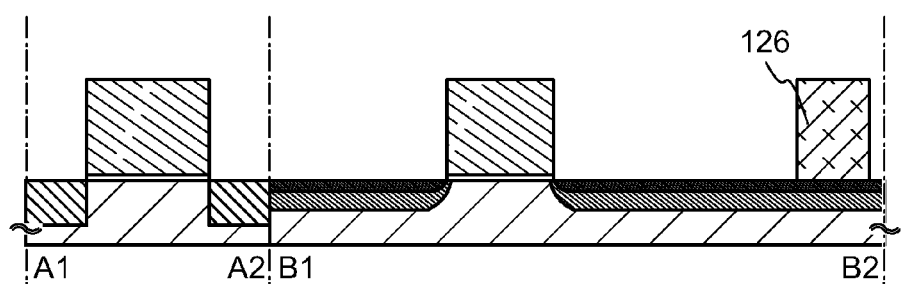

Then, the electrode 126 is formed in a region in contact with part of the metal compound region 124 (see FIG. 3B). The electrode 126 is formed by, for example, forming a layer including a conductive material and then selectively etching the layer. The layer including a conductive material can be formed using a metal material such as aluminum, copper, titanium, tantalum, or tungsten. Further, the layer including a conductive material may be formed using a semiconductor material such as polycrystalline silicon. There is no particular limitation on the method for forming the layer including a conductive material, and any of a variety of film formation methods such as an evaporation method, a CVD method, a sputtering method, and a spin coating method can be employed.

Alternatively, the electrode 126 can be formed by forming an opening reaching the metal compound region 124 in the insulating layer 128 after the formation of the insulating layer 128 and then by filling the opening.

In such a case, for example, it is possible to employ a method in which a thin titanium film is formed by a PVD method and a thin titanium nitride film is formed by a CVD method in a region including the opening, and then a tungsten film is formed so as to fill the opening. Here, the titanium film formed by a PVD method has a function of reducing an oxide film (such as a native oxide film) over which the titanium film is to be formed, and thereby lowering contact resistance with the underlying electrode or the like (the metal compound region 124, here). The titanium nitride film formed after the formation of the titanium film has a barrier function of suppressing diffusion of the conductive material. A copper film may be formed by a plating method after the formation of the barrier film of titanium, titanium nitride, or the like.

Figure 3C:
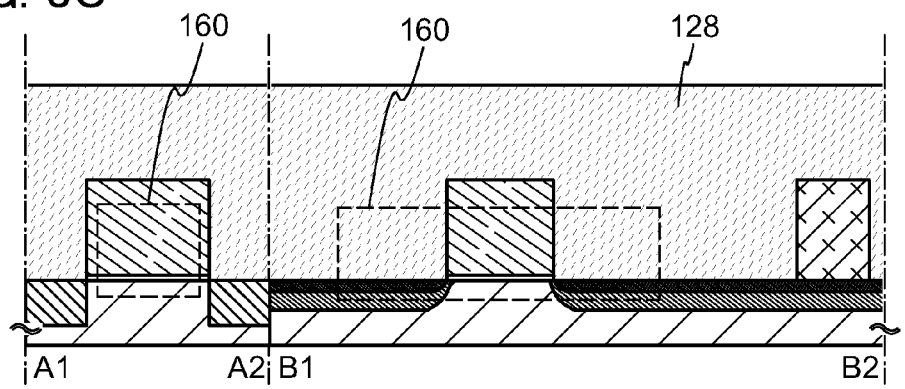

Then, the insulating layer 128 is formed to cover the components formed in the above steps (see FIG. 3C). The insulating layer 128 can be formed using a material including an inorganic insulating material such as silicon oxide, silicon oxynitride, silicon nitride, or aluminum oxide. It is particularly preferable to use a low dielectric constant (low-k) material for the insulating layer 128 because capacitance due to overlap of electrodes or wirings can be sufficiently reduced. Note that the insulating layer 128 may be a porous insulating layer formed using any of those materials. The porous insulating layer has a lower dielectric constant than an insulating layer with high density, and thus allows a further reduction in capacitance generated by electrodes or wirings. Alternatively, the insulating layer 128 can be formed using an organic insulating material such as polyimide or acrylic. Note that although the insulating layer 128 has a single-layer structure of here, one embodiment of the disclosed invention is not limited to this. The insulating layer may have a stacked-layer structure including two or more layers.

Through the above steps, the transistor 160 is formed with the use of the substrate 100 including a semiconductor material (see FIG. 3C). Such a transistor 160 is capable of high speed operation. By using this transistor as a read transistor, data can be read out at high speed.

Figure 3D:
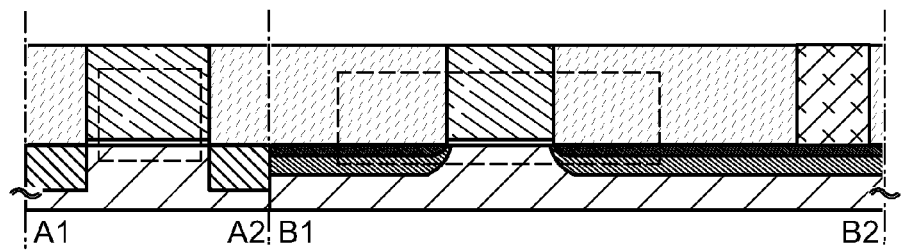

After that, as a treatment before the formation of the transistor 162 and the capacitor 164, CMP treatment is performed on the insulating layer 128 to expose upper surfaces of the gate electrode 110 and the electrode 126 (see FIG. 3D). As treatment for exposing the upper surfaces of the gate electrode 110 and the electrode 126, etching treatment or the like can also be employed as well as CMP treatment; in order to improve characteristics of the transistor 162, the surface of the insulating layer 128 is preferably made as flat as possible.

Note that before or after each of the above steps, a step of forming an electrode, a wiring, a semiconductor layer, an insulating layer, or the like may be further performed. For example, the wiring may have a multi-layer structure including a stack of an insulating layer and a conductive layer to provide a highly integrated semiconductor device.

<Method for Manufacturing Transistor in Upper Portion>

Figure 4A:
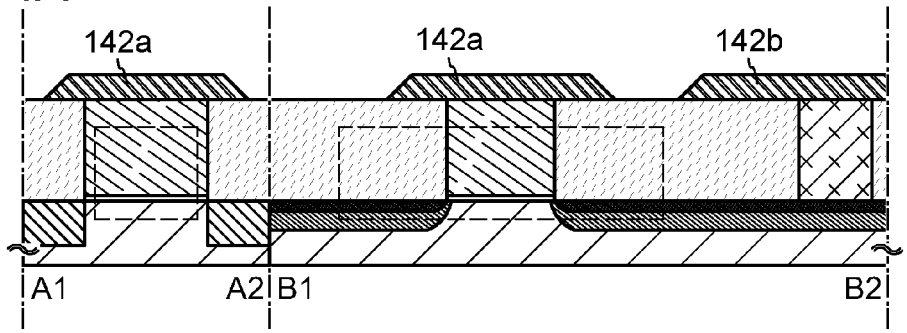
FIGS. 4A to 4D are cross-sectional views illustrating a manufacturing process of a semiconductor device.

Then, a conductive layer is formed over the gate electrode 110, the electrode 126, the insulating layer 128, and the like, and is selectively etched, whereby the source or drain electrode 142a and the source or drain electrode 142b are formed (see FIG. 4A).

The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy including any of these elements as a component; or the like can be used. Any of manganese, magnesium, zirconium, beryllium, neodymium, scandium, or a material including any of these in combination may be used.

The conductive layer may have a single-layer structure or a stacked-layer structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked. Note that in the case where the conductive layer has a single-layer structure of a titanium film or a titanium nitride film, there is an advantage that the conductive layer is easily processed into the source or drain electrode 142a and the source or drain electrode 142b having a tapered shape.

The conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which may be abbreviated to ITO), an indium oxide-zinc oxide alloy ($In_2O_3$—ZnO), or any of these metal oxide materials including silicon or silicon oxide can be used.

The conductive layer is preferably etched such that the source or drain electrode 142a and the source or drain electrode 142b are formed to have tapered end portions. Here, the taper angle is preferably 30° to 60°, for example. When the end portions of the source or drain electrode 142a and the source or drain electrode 142b are etched to be tapered, the coverage with the gate insulating layer 146 formed later can be improved and a break due to a step can be prevented.

The channel length (L) of the transistor in the upper portion is determined by the distance between a lower end portion of the source or drain electrode 142a and a lower end portion of the source or drain electrode 142b. Note that in light exposure for forming a mask for a transistor with a channel length (L) of less than 25 nm, it is preferable to use extreme ultraviolet rays whose wavelength is as short as several nanometers to several tens of nanometers. The resolution of light exposure with extreme ultraviolet rays is high and the depth of focus is large. For these reasons, the channel length (L) of the transistor formed later can be 10 nm to 1000 nm (1 μm) inclusive, whereby the operation speed of a circuit can be increased. Moreover, power consumption of the semiconductor device can be reduced by miniaturization.

Note that an insulating layer serving as a base may be provided over the interlayer insulating layer 128. The insulating layer can be formed by a PVD method, a CVD method, or the like.

Further, an insulating layer may be formed over the source or drain electrode 142a and the source or drain electrode 142b. The insulating layer is formed to overlap with part of a gate electrode which is formed later. By providing such an insulating layer, capacitance between the gate electrode and the source or drain electrode can be reduced.

Figure 4B:
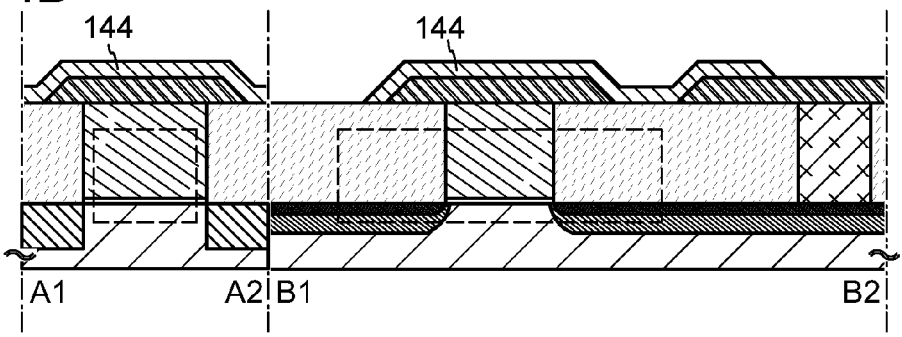

Then, the oxide semiconductor layer 144 is formed by forming an oxide semiconductor layer to cover the source or drain electrode 142a and the source or drain electrode 142b and then by selectively etching the oxide semiconductor layer (see FIG. 4B).

The oxide semiconductor layer includes at least one element selected from In, Ga, Sn, and Zn. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. The above oxide semiconductors may include an element other than In, Ga, Sn, and Zn, for example, $SiO_2$.

For example, an In—Ga—Zn—O-based oxide semiconductor means an oxide semiconductor including indium (In), gallium (Ga), and zinc (Zn), and there is no limitation on the composition ratio thereof.

In particular, an In—Ga—Zn—O-based oxide semiconductor material has sufficiently high resistance when there is no electric field and the off-state current can be sufficiently reduced. In addition, the In—Ga—Zn—O-based oxide semiconductor material has high field-effect mobility and thus is suitable as a semiconductor material used for a semiconductor device.

As a typical example of the In—Ga—Zn—O-based oxide semiconductor material, the one represented by $InGaO_3(ZnO)_m$ (m>0) is given. In addition, an oxide semiconductor material in which Ga is replaced by M and which is represented by $InMO_3(ZnO)_m$ (m>0) can also be given. Here, M denotes one or more metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like. Note that the above compositions are merely examples given in accordance with a crystal structure.

As a target for forming the oxide semiconductor layer by a sputtering method, a target having a composition ratio given by the equation In:Ga:Zn=1:x:y (x is 0 or more, and y is 0.5 to 5 inclusive) is preferably used. For example, a metal oxide target having a composition ratio given by the equation $In_2O_3$:$Ga_2O_3$:ZnO=1:1:2 [molar ratio], or the like can be used. Alternatively, a metal oxide target having a composition ratio given by the equation $In_2O_3$:$Ga_2O_3$:ZnO=1:1:1 [molar ratio], a metal oxide target having a composition ratio given by the equation $In_2O_3$:$Ga_2O_3$:ZnO=1:1:4 [molar ratio], or a metal oxide target having a composition ratio given by the equation $In_2O_3$:$Ga_2O_3$:ZnO=1:0:2 [molar ratio] can be used.

When an In—Zn—O-based material is used as an oxide semiconductor, a target to be used has a composition ratio given by the equation In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 to in a molar ratio). For example, the target used for deposition of an In—Zn—O-based oxide semiconductor has a composition ratio of Z>1.5X+Y when In:Zn:O=X:Y:Z in an atomic ratio.

In this embodiment, an oxide semiconductor layer having an amorphous structure is formed by a sputtering method using an In—Ga—Zn—O-based metal oxide target.

The relative density of the metal oxide in the metal oxide target is 80% or higher, preferably 95% or higher, more preferably 99.9% or higher. With the use of the metal oxide target with high relative density, the oxide semiconductor layer can be formed to have a dense structure.

The atmosphere in which the oxide semiconductor layer is formed is preferably a rare gas (typically argon) atmosphere, an oxygen atmosphere, or a mixed atmosphere including a rare gas (typically argon) and oxygen. Specifically, it is preferable to use a high-purity gas atmosphere, for example, from which impurities such as hydrogen, water, hydroxyl, or hydride are removed to 1 ppm or less (preferably to 10 ppb or less).

In the formation of the oxide semiconductor layer, for example, an object to be processed is held in a process chamber that is kept under reduced pressure and the object is heated to a temperature higher than or equal to 100° C. and lower than 550° C., preferably 200° C. to 400° C. inclusive. Alternatively, the temperature of the object in the formation of the oxide semiconductor layer may be room temperature (25° C.±10° C., 15° C. to 35° C. inclusive). While moisture in the process chamber is removed, a sputtering gas from which hydrogen, water, and the like are removed is introduced, and the above target is used; thus, the oxide semiconductor layer is formed. The oxide semiconductor layer is formed while the object is heated, whereby impurities in the oxide semiconductor layer can be reduced. In addition, damage due to sputtering can be reduced. In order to remove moisture in the process chamber, an entrapment vacuum pump is preferably used. For example, a cryopump, an ion pump, or a titanium sublimation pump can be used. Further, a turbo molecular pump provided with a cold trap may be used. By evacuation with a cryopump or the like, hydrogen, water, and the like can be removed from the process chamber, whereby the impurity concentration of the oxide semiconductor layer can be reduced.

The oxide semiconductor layer can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferable because powdery substances (also referred to as particles or dust) formed at the time of film formation can be reduced and the film thickness can be uniform. The thickness of the oxide semiconductor layer is 1 nm to 50 nm inclusive, preferably 1 nm to 30 nm inclusive, more preferably 1 nm to 10 nm inclusive. The use of the oxide semiconductor layer of such a thickness makes it possible to suppress a short-channel effect which is caused by miniaturization. Note that the appropriate thickness of the oxide semiconductor layer differs depending on the oxide semiconductor material to be used, the application of the semiconductor device, or the like; therefore, the thickness can also be determined in accordance with the material, the application or the like.

Note that before the oxide semiconductor layer is formed by a sputtering method, reverse sputtering in which plasma is generated with an argon gas introduced is preferably performed, so that substances attached to a surface on which the oxide semiconductor layer is to be formed (e.g., a surface of the insulating layer 128) are removed. Here, the reverse sputtering refers to a method in which ions collide with a surface of the substrate to be processed in order to modify the surface, in contrast to normal sputtering which refers to a method in which ions collide with a sputtering target. An example of a method for making ions collide with a surface to be processed is a method in which high-frequency voltage is applied to the surface in an argon atmosphere so that plasma is generated near an object. Note that an atmosphere of nitrogen, helium, oxygen, or the like may be used instead of an argon atmosphere.

After that, heat treatment (first heat treatment) is preferably performed on the oxide semiconductor layer. By the first heat treatment, excessive hydrogen (including water and hydroxyl) in the oxide semiconductor layer can be removed, the structure of the oxide semiconductor layer can be improved, and defect states in the energy gap can be reduced. The temperature of the first heat treatment is, for example, higher than or equal to 300° C. and lower than 550° C., or 400° C. to 500° C. inclusive.

The heat treatment can be performed in such a manner that, for example, the object is introduced into an electric furnace provided with a resistance heating element or the like and heated at 450° C. for one hour in a nitrogen atmosphere. During the heat treatment, the oxide semiconductor layer is not exposed to air to prevent entry of water and hydrogen.

The heat treatment apparatus is not limited to an electric furnace and may be an apparatus for heating an object by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas that does not react with the object by heat treatment, for example, nitrogen or a rare gas such as argon is used.

For example, as the first heat treatment, GRTA treatment may be performed in which the object is put in a heated inert gas atmosphere and heated for several minutes, and then taken out of the inert gas atmosphere. GRTA treatment enables high-temperature heat treatment for a short time. Moreover, GRTA treatment enables treatment at a temperature which exceeds the upper temperature limit. Note that the inert gas may be changed to a gas including oxygen during the treatment. This is because defect states in the energy gap due to oxygen vacancies can be reduced by performing the first heat treatment in an atmosphere including oxygen.

Note that as the inert gas atmosphere, an atmosphere that includes nitrogen or a rare gas (such as helium, neon, or argon) as its main component and does not include water, hydrogen, or the like is preferably used. For example, the purity of nitrogen or a rare gas such as helium, neon, or argon introduced into the heat treatment apparatus is higher than or equal to 6N (99.9999%), preferably higher than or equal to 7N (99.99999%) (that is, the concentration of an impurity is lower than or equal to 1 ppm, preferably lower than or equal to 0.1 ppm).

In any case, a transistor with significantly excellent characteristics can be obtained with the use of an i-type (intrinsic) or substantially i-type oxide semiconductor layer which is obtained by reducing impurities through the first heat treatment.

The above heat treatment (the first heat treatment) has an effect of removing hydrogen, water, and the like and can also be referred to as dehydration treatment, dehydrogenation treatment, or the like. The dehydration treatment or the dehydrogenation treatment can be performed, for example, after the oxide semiconductor layer is formed, after the gate insulating layer is formed, or after a gate electrode is formed. Such dehydration treatment or dehydrogenation treatment may be performed once or more times.

The etching of the oxide semiconductor layer may be performed before or after the heat treatment. Dry etching is preferably used in terms of element miniaturization, but wet etching may be used. An etching gas and an etchant can be selected as appropriate in accordance with a material to be etched. Note that in the case where a problem of leakage current and the like between elements does not occur, the oxide semiconductor layer may be used without being processed into an island shape.

Next, the gate insulating layer 146 in contact with the oxide semiconductor layer 144 is formed. Then, over the gate insulating layer 146, the gate electrode 148a is formed in a region overlapping with the oxide semiconductor layer 144 (see FIG. 4C).

The gate insulating layer 146 can be formed by a CVD method, a sputtering method, or the like. The gate insulating layer 146 preferably includes gallium oxide, silicon oxide, silicon nitride, silicon oxynitride, aluminum oxide, tantalum oxide, hafnium oxide, yttrium oxide, hafnium silicate (Hf-$Si_xO_y$ ($x>0$, $y>0$)), hafnium silicate to which nitrogen is added ($HfSi_xO_yN_z$ ($x>0$, $y>0$, $z>0$)), hafnium aluminate to which nitrogen is added ($HfAl_xO_yN_z$ ($x>0$, $y>0$, $z>0$)), and the like. The gate insulating layer 146 may have a single-layer structure or a stacked-layer structure. There is no particular limitation on the thickness of the gate insulating layer 146; in the case where the semiconductor device is miniaturized, the gate insulating layer 146 is preferably thin in order to ensure the operation of the transistor. For example, in the case of using silicon oxide, the thickness can be 1 nm to 100 nm inclusive, preferably 10 nm to and 50 nm inclusive.

When the gate insulating layer is thin as in the above description, a problem of gate leakage due to a tunneling effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ ($x>0$, $y>0$)), hafnium silicate to which nitrogen is added ($HfSi_xO_yN_z$ ($x>0$, $y>0$, $z>0$)), or hafnium aluminate to which nitrogen is added ($HfAl_xO_yN_z$ ($x>0$, $y>0$, $z>0$)). By using a high-k material for the gate insulating layer 146, electrical characteristics can be ensured and the thickness of the gate insulating layer 146 can be large to prevent gate leakage. Note that a stacked-layer structure of a film including a high-k material and a film including any of silicon oxide, silicon nitride, silicon oxynitride, silicon nitride oxide, aluminum oxide, and the like may be employed.

After the gate insulating layer 146 is formed, second heat treatment is preferably performed in an inert gas atmosphere or an oxygen atmosphere. The temperature of the heat treatment is 200° C. to 450° C. inclusive, preferably 250° C. to 350° C. inclusive. For example, the heat treatment may be performed at 250° C. for one hour in a nitrogen atmosphere. The second heat treatment can reduce variation in electric characteristics of the transistors. Moreover, in the case where the gate insulating layer 146 includes oxygen, oxygen can be supplied to the oxide semiconductor layer 144 to fill oxygen vacancies in the oxide semiconductor layer 144, whereby an i-type (intrinsic) or substantially i-type oxide semiconductor layer 144 can be formed.

Note that the second heat treatment is performed after the gate insulating layer 146 is formed in this embodiment, but the timing of the second heat treatment is not limited to this. For example, the second heat treatment may be performed after the gate electrode is formed. Alternatively, the first heat treatment and the second heat treatment may be successively performed, the first heat treatment may double as the second heat treatment, or the second heat treatment may double as the first heat treatment.

As described above, at least one of the first heat treatment and the second heat treatment is employed, whereby impurities which are not the main components of the oxide semiconductor are excluded as much as possible and the oxide semiconductor layer 144 can be purified.

The gate electrode 148a can be formed by forming a conductive layer over the gate insulating layer 146 and then selectively etching the conductive layer. The conductive layer to be processed into the gate electrode 148a can be formed by a PVD method such as a sputtering method, or a CVD method such as a plasma CVD method. The details are similar to those of the source or drain electrode 142a or the like; thus, the description thereof can be referred to. Through the above process, the transistor 162 can be formed.

Figure 4C:
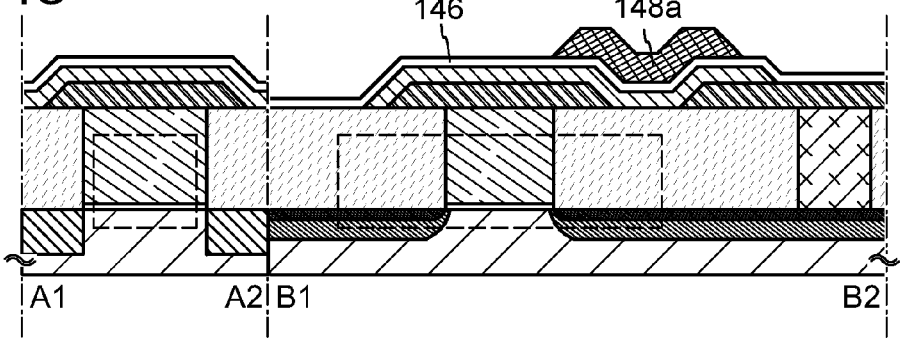
Figure 4D:
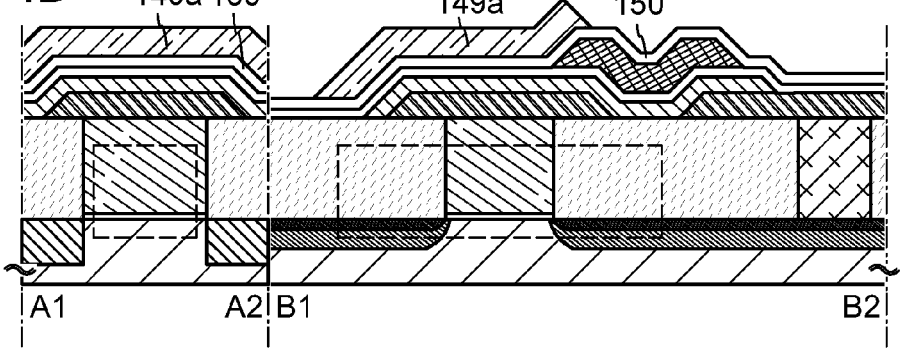

Then, the insulating layer 150 is formed to cover the gate insulating layer 146 and the gate electrode 148a, and then the electrode 149a is formed over the insulating layer 150 and in a region overlapping with the source or drain electrode 142a (see FIG. 4D). Before the formation of the insulating layer 150, the gate insulating layer 146 in a region where the capacitor 164 is to be formed may be removed. By removing the gate insulating layer 146 in the region where the capacitor 164 is to be formed, the capacitance of the capacitor 164 can be increased.

The insulating layer 150 can be formed by a CVD method, a sputtering method, or the like. The details are similar to those of the gate insulating layer 146 or the like; thus, the description thereof can be referred to.

The electrode 149a can be formed by forming a conductive layer over the insulating layer 150 and then selectively etching the conductive layer. The conductive layer to be processed into the electrode 149a can be formed by a PVD method such as a sputtering method, or a CVD method such as a plasma CVD method. The details are similar to those of the source or drain electrode 142a or the like; thus, the description thereof can be referred to. Through the above process, the capacitor 164 can be formed.

The electrode 149a, which is a capacitor electrode, is preferably formed to overlap with at least part of the gate electrode 148a of the transistor 162. In addition, the electrode 149a may be formed to overlap with at least part of the gate electrode 110 of the transistor 160. This is because by employing such a structure, the area of the circuit can be sufficiently reduced. Note that this structure owes to the use of different conductive layers for the formation of the gate electrode 148a and the electrode 149a. When the gate electrode 148a and the electrode 149a are formed using one conductive layer, it will be difficult to sufficiently reduce the distance between these electrodes because of the formation process constraint. In contrast, when the gate electrode 148a and the electrode 149a are formed using different conductive layers, the distance between these electrodes can be sufficiently reduced, and even a structure where the electrodes partly overlap with each other can be employed, which leads to higher integration.

Figure 5A:
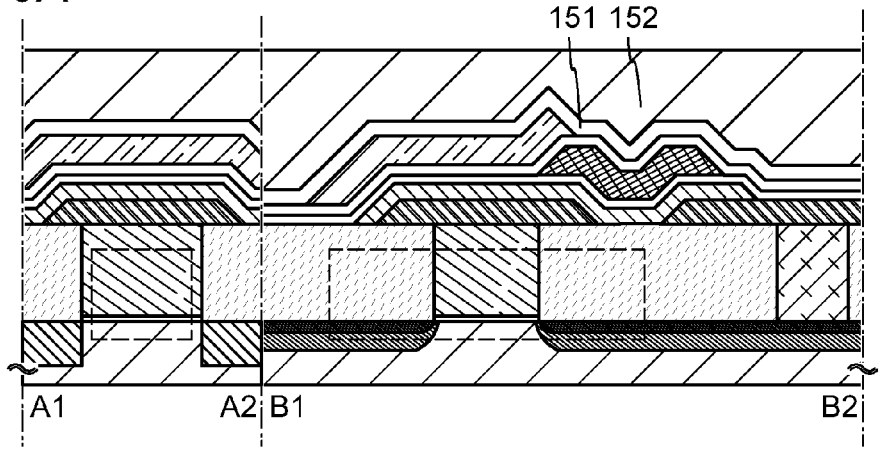
FIGS. 5A to 5C are cross-sectional views illustrating a manufacturing process of a semiconductor device.

Then, the insulating layer 151 and the insulating layer 152 are formed over the insulating layer 150 and the electrode 149a (see FIG. 5A). The insulating layer 151 and the insulating layer 152 can be formed by a PVD method, a CVD method, or the like. The insulating layer 151 and the insulating layer 152 can be formed using a material including an inorganic insulating material such as silicon oxide, silicon oxynitride, silicon nitride, hafnium oxide, or aluminum oxide.

Note that for the insulating layer 151 and the insulating layer 152, a material with a low dielectric constant may be preferably used or a structure with a low dielectric constant (e.g., a porous structure) may be preferably employed. This is because when the insulating layer 151 and the insulating layer 152 have a low dielectric constant, capacitance generated between wirings, electrodes, or the like can be reduced and operation at higher speed can be achieved.

Note that although a stacked-layer structure of the insulating layer 151 and the insulating layer 152 is used in this embodiment, one embodiment of the present invention is not limited thereto. A single-layer structure or a stacked-layer structure including three or more layers can be used. Alternatively, the insulating layer may be omitted.

Note that the insulating layer 152 is preferably formed so as to have a planarized surface. This is because when the insulating layer 152 has a planarized surface, an electrode, a wiring, or the like can be favorably formed over the insulating layer 152 even in the case where the semiconductor device is miniaturized. Note that the insulating layer 152 can be planarized by a method such as CMP treatment.

Figure 5B:
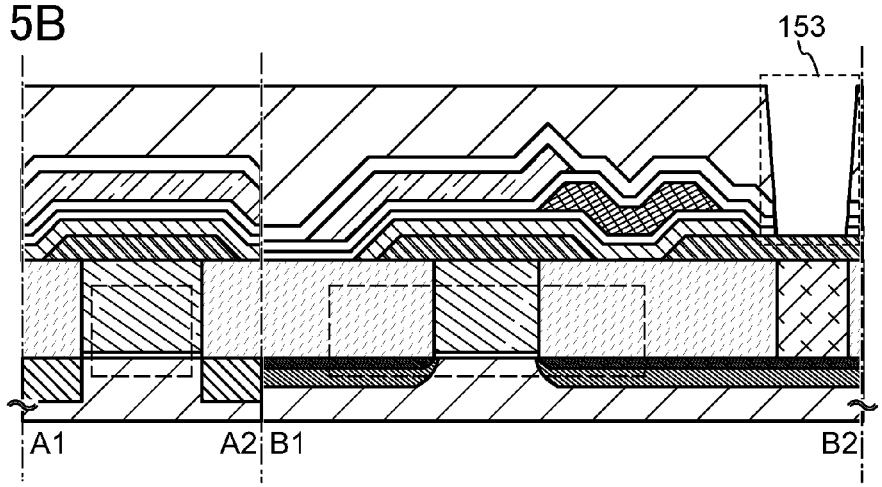

Then, an opening 153 reaching the source or drain electrode 142b is formed in the gate insulating layer 146, the insulating layer 150, the insulating layer 151, and the insulating layer 152 (see FIG. 5B). The opening 153 is formed by selective etching using a mask or the like.

Here, the opening 153 is preferably formed in a region overlapping with the electrode 126. By forming the opening 153 in this region, the element area can be prevented from increasing due to a contact region of the electrodes. In other words, the degree of integration in the semiconductor device can be improved.

Figure 5C:
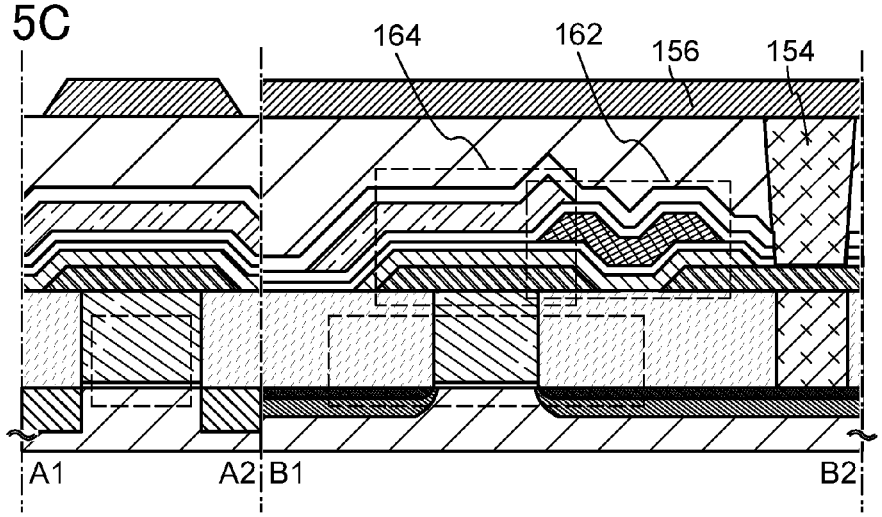

Then, the electrode 154 is formed in the opening 153 and the wiring 156 in contact with the electrode 154 is formed over the insulating layer 152 (see FIG. 5C).

The electrode 154 can be formed in such a manner that, for example, a conductive layer is formed by a PVD method, a CVD method, or the like in a region including the opening 153 and then part of the conductive layer is removed by etching treatment, CMP treatment, or the like.

Specifically, it is possible to employ a method, for example, in which a thin titanium film is formed by a PVD method in a region including the opening 153 and a thin titanium nitride film is formed by a CVD method, and then a tungsten film is formed so as to fill the opening 153. Here, the titanium film formed by a PVD method has a function of reducing an oxide film (such as a native oxide film) over which the titanium film is to be formed, and thereby lowering contact resistance with the underlying electrode or the like (the source or drain electrode 142b, here). The titanium nitride film formed after the formation of the titanium film has a barrier function of suppressing diffusion of the conductive material. A copper film may be formed by a plating method after the formation of the barrier film of titanium, titanium nitride, or the like.

Note that in the case where the electrode 154 is formed by removing part of the conductive layer, it is preferable that a surface of the electrode 154 be processed to be planarized. For example, when a thin titanium film or a thin titanium nitride film is formed in a region including the opening 153 and then a tungsten film is formed so as to fill the opening 153, an unnecessary portion of the tungsten film, titanium film, titanium nitride film, or the like can be removed and the planarity of the surface can be improved by subsequent CMP treatment. The surface including the electrode 154 is planarized in this manner, so that an electrode, a wiring, an insulating layer, a semiconductor layer, or the like can be favorably formed in a later step.

The wiring 156 can be formed by forming a conductive layer by a PVD method such as a sputtering method, or a CVD method such as a plasma CVD method, and then by patterning the conductive layer. As a material for the conductive layer, an element selected from aluminum, chromium, copper, tantalum, titanium, molybdenum, and tungsten; an alloy including any of these elements as a component; or the like can be used. Any of manganese, magnesium, zirconium, beryllium, neodymium, scandium, or a material including any of these in combination may be used. The details are similar to those of the source or drain electrodes 142a, 142b, and the like.

Through the above steps, the transistor 162 including the purified oxide semiconductor layer 144 and the capacitor 164 are completed (see FIG. 5C).

In the transistor 162 described in this embodiment, because the oxide semiconductor layer 144 is purified, the hydrogen concentration thereof is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. In addition, the carrier density of the oxide semiconductor layer 144 is sufficiently low (e.g., lower than $1 \times 10^{12}$/cm$^3$, preferably lower than $1.45 \times 10^{10}$/cm$^3$) as compared to the carrier density of a general silicon wafer (approximately $1 \times 10^{14}$/cm$^3$). Thus, the off-state current is sufficiently low. For example, the off-state current (here, current per micrometer (μm) of channel width) of the transistor 162 at room temperature (25° C.) is smaller than or equal to 100 zA (1 zA (zeptoampere) is $1 \times 10^{-21}$ A), preferably smaller than or equal to 10 zA.

By using the purified intrinsic oxide semiconductor layer 144, the off-state current of the transistor can be sufficiently reduced. Further, with the use of such a transistor, a semiconductor device capable of holding stored data for an extremely long time can be obtained.

By forming the gate electrode 148a of the transistor 162 and the electrode 149a of the capacitor 164 using different conductive layers and by providing the insulating layer 150 which covers the transistor 162, the distance between the gate electrode and the capacitor electrode can be sufficiently reduced. This allows a structure in which these electrodes partly overlap with each other, whereby a semiconductor device with a higher integration degree can be provided.

Modification Example

Next, another structure of the semiconductor device in FIGS. 1A and 1B will be described with reference to FIGS. 6A and 6B.

<Cross-Sectional Structure and Planar Structure of Semiconductor Device>

Figure 6A:
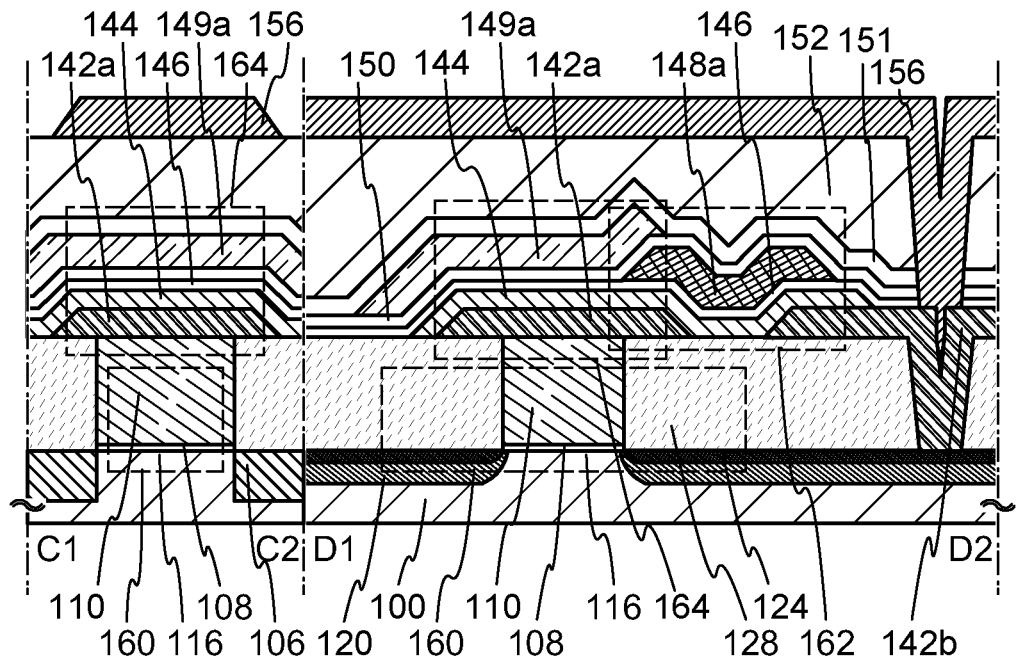
FIGS. 6A and 6B are a cross-sectional view and a plan view of a semiconductor device.
Figure 6B:
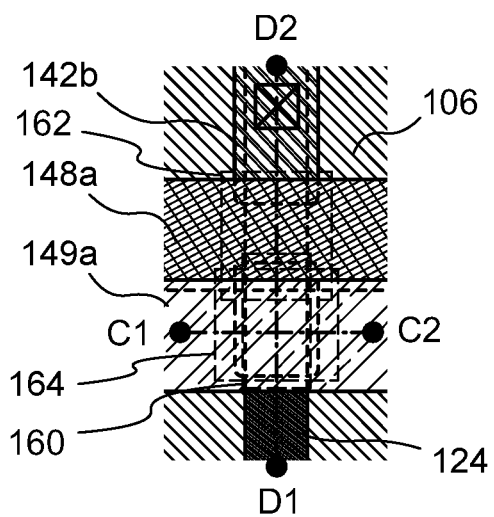

FIG. 6A is a cross-sectional view of the semiconductor device, and FIG. 6B is a plan view of the semiconductor device. Here, FIG. 6A illustrates a cross section taken along line C1-C2 and line D1-D2 in FIG. 6B. The semiconductor device illustrated in FIGS. 6A and 6B, like the semiconductor device illustrated in FIGS. 1A and 1B, includes the transistor 160 including a first semiconductor material in the lower portion, and the transistor 162 including a second semiconductor material in the upper portion. Here, it is preferable that the first semiconductor material and the second semiconductor material be different from each other. For example, the first semiconductor material can be a material (silicon) which is not an oxide semiconductor and the second semiconductor material can be an oxide semiconductor. A transistor including a semiconductor material (e.g., single crystal silicon) which is not an oxide semiconductor can easily operate at high speed. On the other hand, a transistor including an oxide semiconductor can hold charge for a long time owing to its characteristics.

One of the differences between the semiconductor device in FIGS. 6A and 6B and the semiconductor device in FIGS. 1A and 1B is a method of connecting the transistor 160 to the transistor 162. In the semiconductor device in FIGS. 1A and 1B, the electrode 126 is formed in a region in contact with part of the metal compound region 124, and the metal compound region 124 of the transistor 160 in the lower portion and the source or drain electrode 142b of the transistor 162 in the upper portion are electrically connected to each other through the electrode 126. In contrast, in the semiconductor device in FIGS. 6A and 6B, the source or drain electrode 142b of the transistor 162 in the upper portion is directly in contact with the metal compound region 124 of the transistor 160 in the lower portion.

Another difference between the semiconductor device in FIGS. 6A and 6B and the semiconductor device in FIGS. 1A and 1B is a method of connecting the transistor 162 and the wiring 156 in the upper portion. In the semiconductor device in FIGS. 1A and 1B, the electrode 154 in contact with the source or drain electrode 142b is formed, and the source or drain electrode 142b of the transistor 162 and the wiring 156 are electrically connected to each other through the electrode 154. In contrast, in the semiconductor device in FIGS. 6A and 6B, the wiring 156 is directly in contact with the source or drain electrode 142b of the transistor 162.

Note that in FIGS. 6A and 6B, a region in which the source or drain electrode 142b is in contact with one of the source region and the drain region of the transistor 160 overlaps with a region in which the source or drain electrode 142b is in contact with the wiring 156 for connecting one memory cell to another memory cell. Such a layout allows an increase in the degree of integration.

<Method for Manufacturing Semiconductor Device>

A manufacturing method of the semiconductor device illustrated in FIGS. 6A and 6B, particularly, the source or drain electrode of the transistor 162 in the upper portion will be described.

As in the steps illustrated in FIGS. 2A to 2D and FIGS. 3A to 3D, the channel formation region 116, the impurity regions 120, and the metal compound regions 124 are formed in the substrate, and the gate insulating layer 108 and the gate electrode 110 are formed over the substrate. After that, the insulating layer 128 is formed to cover the formed components. Accordingly, the transistor 160 is formed.

Then, CMP treatment is performed on the insulating layer 128 to expose an upper surface of the gate electrode 110. As treatment for exposing the upper surface of the gate electrode 110, etching treatment or the like can also be employed as well as CMP treatment; in order to improve characteristics of the transistor 162 which is formed later, the surfaces of the insulating layer 128 is preferably made as flat as possible.

Then, an opening reaching the metal compound region 124 of the transistor 160 is formed in the insulating layer 128. The opening is formed by selective etching using a mask or the like.

Then, a conductive layer is formed in a region including the opening by a PVD method, a CVD method, or the like. After that, part of the conductive layer is selectively removed by etching treatment, CMP treatment, or the like, whereby the source or drain electrode 142a and the source or drain electrode 142b are formed. The conductive layer is formed so as to fill the opening, whereby the metal compound region 124 and the source or drain electrode 142b are directly in contact with each other.

Then, as in the steps illustrated in FIGS. 4B to 4D, the oxide semiconductor layer 144 over the source or drain electrode 142a and the source or drain electrode 142b, the gate insulating layer 146 in contact with the oxide semiconductor layer 144, the gate electrode 148a over the gate insulating layer 146, the insulating layer 150 over the gate electrode 148a, and the electrode 149a over the insulating layer 150 are formed.

Then, as in the steps illustrated in FIGS. 5A to 5C, the insulating layer 151 and the insulating layer 152 are formed to cover the electrode 149a. After the insulating layer 151 and the insulating layer 152 are formed, an opening reaching the source or drain electrode 142b is formed in the insulating layer 152, the insulating layer 151, the insulating layer 150, and the gate insulating layer 146. The opening is formed by selective etching using a mask or the like.

Then, a conductive layer is formed in a region including the opening by a PVD method, a CVD method, or the like. After that, part of the conductive layer is selectively removed by etching treatment, CMP treatment, or the like, whereby the wiring 156 is formed.

Through the above process, the semiconductor device in FIGS. 6A and 6B can be formed. In the semiconductor device in FIGS. 6A and 6B, the direct connection between the transistor 160 in the lower portion and the transistor 162 in the upper portion and the direct connection between the transistor 162 in the upper portion and the wiring 156 are each made through the source or drain electrode 142b of the transistor 162 in the upper portion without formation of another electrode. Thus, a step therefor can be omitted. Therefore, the semiconductor device described in this embodiment can be manufactured at low cost.

The structures, methods, and the like described in this embodiment can be combined as appropriate with any of the structures and methods described in the other embodiments.

Embodiment 2

In this embodiment, a structure and a manufacturing method of a semiconductor device according to another embodiment of the disclosed invention will be described with reference to FIGS. 7A and 7B, FIGS. 8A to 8H, FIGS. 9A to 9E, and FIGS. 10A and 10B.

<Cross-sectional Structure and Planar Structure of Semiconductor Device>

Figure 7A:
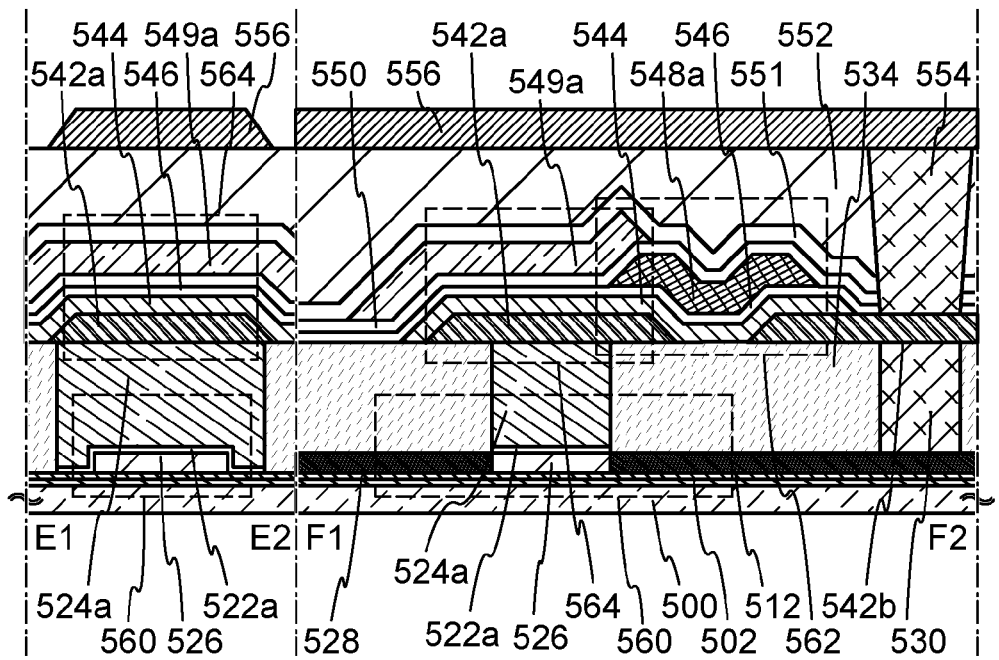
FIGS. 7A and 7B are a cross-sectional view and a plan view of a semiconductor device.
Figure 7B:
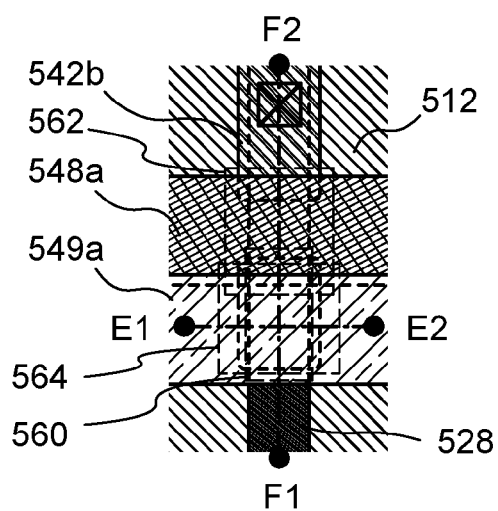

FIGS. 7A and 7B illustrate an example of a structure of the semiconductor device according to this embodiment. FIG. 7A is a cross-sectional view of the semiconductor device, and FIG. 7B is a plan view of the semiconductor device. Here, FIG. 7A illustrates a cross section taken along line E1-E2 and line F1-F2 in FIG. 7B. The semiconductor device illustrated in FIGS. 7A and 7B includes a transistor 560 including a first semiconductor material in the lower portion, and a transistor 562 including a second semiconductor material in the upper portion. Here, it is preferable that the first semiconductor material and the second semiconductor material be different from each other. For example, the first semiconductor material can be a material (silicon) which is not an oxide semiconductor and the second semiconductor material can be an oxide semiconductor. A transistor including a semiconductor material (e.g., single crystal silicon) which is not an oxide semiconductor can easily operate at high speed. On the other hand, a transistor including an oxide semiconductor can hold charge for a long time owing to its characteristics.

Although both of the transistors are n-channel transistors in this description, it should be appreciated that p-channel transistors can be used. Since the technical feature of the disclosed invention lies in the use of a semiconductor material like an oxide semiconductor, which can sufficiently reduce off-state current, for the transistor 562 in order to hold data, it is not necessary to limit specific conditions such as a structure, material, or the like of the semiconductor device to those given here.

The transistor 560 illustrated in FIGS. 7A and 7B includes a channel formation region 526 provided in a semiconductor layer over a base substrate 500, impurity regions 528 provided so that the channel formation region 526 is sandwiched therebetween, a gate insulating layer 522a provided over the channel formation region 526, and a gate electrode 524a provided over the gate insulating layer 522a. In other words, one of the differences between the transistor 560 in FIGS. 7A and 7B and the transistor 160 in FIGS. 1A and 1B is whether or not the channel formation region is formed in the semiconductor layer. It can also be said that the difference is that a semiconductor substrate is used in FIGS. 1A and 1B while an SOI substrate is used in FIGS. 7A and 7B. Note that a transistor whose source electrode and drain electrode are not illustrated in a drawing may be referred to as a transistor for the sake of convenience.

An electrode 530 is connected to part of the impurity region 528 of the transistor 560. Here, the electrode 530 serves as a source electrode or a drain electrode of the transistor 560. An insulating layer 534 is provided to cover the transistor 560. Note that in order to increase the degree of integration, it is preferable that the transistor 560 do not include sidewall insulating layers as illustrated in FIGS. 7A and 7B. On the other hand, when the characteristics of the transistor 560 have priority, the sidewall insulating layer may be formed on a side surface of the gate electrode 524a and the impurity region 528 may include a region having a different impurity concentration.

The transistor 562 in FIGS. 7A and 7B is the same as the transistor 162 in FIGS. 1A and 1B. In other words, the transistor 562 in FIGS. 7A and 7B includes a source or drain electrode 542a and a source or drain electrode 542b which are provided over the insulating layer 534, an oxide semiconductor layer 544 electrically connected to the source or drain electrode 542a and the source or drain electrode 542b, a gate insulating layer 546 covering the source or drain electrode 542a, the source or drain electrode 542b, and the oxide semiconductor layer 544, and a gate electrode 548a provided over the gate insulating layer 546 so as to overlap with the oxide semiconductor layer 544.

Further, a capacitor 564 in FIGS. 7A and 7B is the same as the capacitor 164 in FIGS. 1A and 1B. In other words, the capacitor 564 in FIGS. 7A and 7B includes the source or drain electrode 542a, the oxide semiconductor layer 544, the gate insulating layer 546, an insulating layer 550, and an electrode 549a. The source or drain electrode 542a serves as one electrode of the capacitor 564 and the electrode 549a serves as the other electrode of the capacitor 564. The above embodiment can be referred to for the other details.

The following structures in FIGS. 7A and 7B are also similar to those in FIGS. 1A and 1B: an insulating layer 551 is provided over the transistor 562 and the capacitor 564; an insulating layer 552 is provided over the insulating layer 551; an electrode 554 is provided in an opening formed in the gate insulating layer 546, the insulating layer 550, the insulating layer 551, the insulating layer 552, and the like; and a wiring 556 connected to the electrode 554 is provided over the insulating layer 552.

<Manufacturing Method of SOI Substrate>

Next, an example of a manufacturing method of an SOI substrate used for forming the above semiconductor devices will be described with reference to FIGS. 8A to 8H.

Figure 8A:
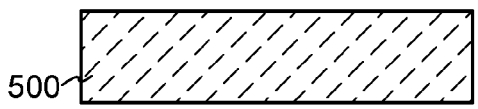
FIGS. 8A to 8H are cross-sectional views illustrating a manufacturing process of a semiconductor substrate used for manufacturing a semiconductor device.

First, the base substrate 500 is prepared (see FIG. 8A). As the base substrate 500, a substrate formed using an insulator can be used. Specific examples thereof include a variety of glass substrates used in the electronics industry, such as aluminosilicate glass, aluminoborosilicate glass, and barium borosilicate glass; a quartz substrate; a ceramic substrate; and a sapphire substrate. Further, a ceramic substrate which contains silicon nitride and aluminum nitride as its main components and whose coefficient of thermal expansion is close to that of silicon may be used.

Alternatively, a semiconductor substrate such as a single crystal silicon substrate or a single crystal germanium substrate may be used as the base substrate 500. In the case where a semiconductor substrate is used as the base substrate 500, an SOI substrate with high quality can be easily obtained because the upper temperature limitation for heat treatment can be raised compared as compared to the case where a glass substrate or the like is used. Here, as a semiconductor substrate, a solar grade silicon (SOG-Si) substrate or the like may be used. Alternatively, a polycrystalline semiconductor substrate may be used. In the case of using a solar grade silicon substrate, a polycrystalline semiconductor substrate, or the like, manufacturing cost can be reduced as compared to the case of using a single crystal silicon substrate or the like.

In this embodiment, the case where a glass substrate is used as the base substrate 500 is described. Cost reduction can be achieved when a glass substrate which can have a larger size and is inexpensive is used as the base substrate 500.

A surface of the base substrate 500 is preferably cleaned in advance. Specifically, the base substrate 500 is subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), a mixed solution of hydrofluoric acid, hydrogen peroxide water, and pure water (FPM), or the like. Through such cleaning treatment, the surface planarity of the base substrate 500 can be improved and abrasive particles left on the surface of the base substrate 500 can be removed.

Figure 8B:
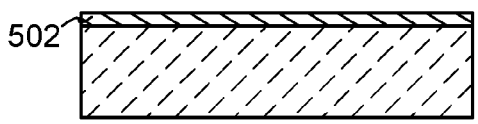
Figure 8C:
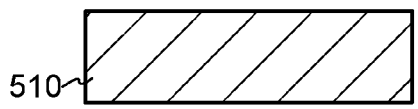

Then, a nitrogen-containing layer 502 (e.g., a layer including an insulating film containing nitrogen, such as a silicon nitride ($SiN_x$) film or a silicon nitride oxide ($SiN_xO_y$ (x>y)) film) is formed over the surface of the base substrate 500 (see FIG. 8B). The nitrogen-containing layer 502 can be formed by a CVD method, a sputtering method, or the like.

The nitrogen-containing layer 502 formed in this embodiment serves as a layer for bonding a single crystal semiconductor layer (i.e., a bonding layer). The nitrogen-containing layer 502 also serves as a barrier layer for preventing impurities contained in the base substrate, such as sodium (Na), from diffusing into the single crystal semiconductor layer.

As described above, since the nitrogen-containing layer 502 is used as the bonding layer in this embodiment, it is preferable that the nitrogen-containing layer 502 be formed to have a certain level of surface planarity. Specifically, the nitrogen-containing layer 502 is formed such that it has an average surface roughness (Ra, which is also referred to as arithmetic mean deviation) of 0.50 nm or less and a root-mean-square surface roughness (RMS) of 0.60 nm or less, preferably an average surface roughness of 0.35 nm or less and a root-mean-square surface roughness of 0.45 nm or less. Note that for the above average surface roughness and root-mean-square surface roughness, for example, a value obtained by the measurement performed on a region of 10 μm×10 μm can be used. The thickness is in the range of from 10 nm to 200 nm, preferably, from 50 nm to 100 nm. With such a high degree of surface planarity, defective bonding of a single crystal semiconductor layer in a later step can be prevented.

Next, a bond substrate is prepared. Here, a single crystal semiconductor substrate 510 is used as the bond substrate (see FIG. 8C). Note that, although a single crystal substrate is used as the bond substrate here, the crystallinity of the bond substrate is not necessarily limited to single crystal.

As the single crystal semiconductor substrate 510, for example, a single crystal semiconductor substrate formed using an element of Group 14, such as a single crystal silicon substrate, a single crystal germanium substrate, or a single crystal silicon germanium substrate, can be used. Further, a compound semiconductor substrate of gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to a circle, and the single crystal semiconductor substrate 510 may be a substrate which has been processed into, for example, a rectangular shape or the like. Further, the single crystal semiconductor substrate 510 can be formed by a Czochralski (CZ) method or a Floating Zone (FZ) method.

Figure 8D:
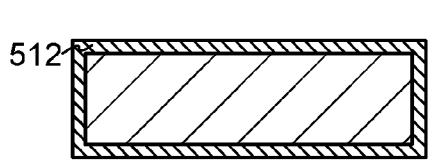

An oxide film 512 is formed on a surface of the single crystal semiconductor substrate 510 (see FIG. 8D). In view of removal of contaminants, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), a mixed solution of hydrofluoric acid, hydrogen peroxide water, and pure water (FPM), or the like before the formation of the oxide film 512. Alternatively, dilute hydrofluoric acid and ozone water may be discharged alternately for cleaning.

The oxide film 512 can be formed to have a single-layer structure or a stacked-layer structure including, a silicon oxide film, a silicon oxynitride film, and the like. As a method for forming the oxide film 512, a thermal oxidation method, a CVD method, a sputtering method, or the like can be used. In the case where the oxide film 512 is formed by a CVD method, a silicon oxide film is preferably formed using organosilane such as tetraethoxysilane (abbreviation: TEOS) (chemical formula: $Si(OC_2H_5)_4$) so that favorable bonding can be achieved.

In this embodiment, the oxide film 512 (here, a $SiO_x$ film) is formed by performing thermal oxidation treatment on the single crystal semiconductor substrate 510. The thermal oxidation treatment is preferably performed in an oxidizing atmosphere to which a halogen is added.

For example, thermal oxidation treatment of the single crystal semiconductor substrate 510 is performed in an oxidizing atmosphere to which chlorine (Cl) is added, whereby the oxide film 512 can be formed through chlorine oxidation. In this case, the oxide film 512 is a film containing chlorine atoms. By such chlorine oxidation, heavy metal (e.g., iron (Fe), chromium (Cr), nickel (Ni), or molybdenum (Mo)) that is an extrinsic impurity is trapped and chloride of the metal is formed and removed to the outside; thus, contamination of the single crystal semiconductor substrate 510 can be reduced. Moreover, after the base substrate 500 and the single crystal semiconductor substrate 510 are bonded to each other, the oxide film 512 captures impurities from the base substrate, such as N, so that contamination of the single crystal semiconductor substrate 510 can be prevented.

Note that the halogen atoms contained in the oxide film 512 are not limited to chlorine atoms. Fluorine atoms may be contained in the oxide film 512. As a method of fluorine oxidation of the surface of the single crystal semiconductor substrate 510, a method in which the single crystal semiconductor substrate 510 is soaked in a hydrogen fluoride (HF) solution and then subjected to thermal oxidation treatment in an oxidizing atmosphere, a method in which thermal oxidation treatment is performed in an oxidizing atmosphere to which nitrogen trifluoride ($NF_3$) is added, or the like can be given.

Figure 8E:
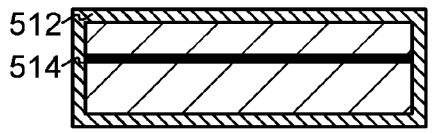
Figure 8F:
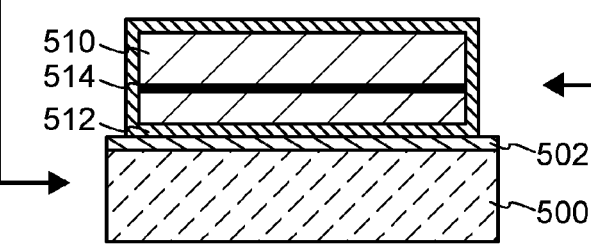

Next, ions are accelerated by an electric field and the single crystal semiconductor substrate 510 is irradiated with the ions and the ions are added to the single crystal semiconductor substrate 510, whereby an embrittled region 514 where the crystal structure is damaged is formed in the single crystal semiconductor substrate 510 at a predetermined depth (see FIG. 8E).

The depth at which the embrittled region 514 is formed can be adjusted by the kinetic energy, mass, charge, or incidence angle of the ions, or the like. The embrittled region 514 is formed at approximately the same depth as the average penetration depth of the ions. Therefore, the thickness of the single crystal semiconductor layer to be separated from the single crystal semiconductor substrate 510 can be adjusted with the depth at which the ions are added. For example, the average penetration depth may be adjusted such that the thickness of a single crystal semiconductor layer is approximately 10 nm to 500 nm inclusive, preferably 50 nm to 200 nm inclusive.

The ion irradiation treatment can be performed with an ion doping apparatus or an ion implantation apparatus. As a typical example of the ion-doping apparatus, there is a non-mass-separation type apparatus in which a process gas is plasma-excited and an object is irradiated with all kinds of ion species generated. In this apparatus, the object is irradiated with ion species of plasma without mass separation. In contrast, an ion implantation apparatus is a mass-separation apparatus. In the ion-implantation apparatus, ion species in plasma are mass separated and the object is irradiated with ion species having predetermined masses.

In this embodiment, an example will be described in which an ion doping apparatus is used for adding hydrogen to the single crystal semiconductor substrate 510. A gas containing hydrogen is used as a source gas. The proportion of $H_3^+$ is preferably set high in the ions used for the irradiation. Specifically, it is preferable that the proportion of $H_3^+$ be set 50% or higher (more preferably, 80% or higher) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be reduced as compared to the case of performing irradiation with hydrogen and helium in different steps, and surface roughness of a single crystal semiconductor layer to be formed later can be suppressed.

Note that heavy metal may also be added when the embrittled region 514 is formed with the ion doping apparatus; however, because the ion irradiation is performed through the oxide film 512 containing halogen atoms, contamination of the single crystal semiconductor substrate 510 due to the heavy metal can be prevented.

Then, the base substrate 500 and the single crystal semiconductor substrate 510 are disposed to face each other, and the surface of the nitrogen-containing layer 502 and the oxide film 512 are firmly attached to each other. Thus, the base substrate 500 and the single crystal semiconductor substrate 510 can be bonded to each other (see FIG. 8F).

When bonding is performed, it is preferable that a pressure of $0.001 \text{ N/cm}^2$ to $100 \text{ N/cm}^2$ inclusive, for example, a pressure of $1 \text{ N/cm}^2$ to $20 \text{ N/cm}^2$ inclusive, be applied to one portion of the base substrate 500 or the single crystal semiconductor substrate 510. When the bonding surfaces are made close to each other and firmly attached to each other by applying a pressure, a bonding between the nitrogen-containing layer 502 and the oxide film 512 is caused at the part where they are firmly attached to each other, and the bonding spontaneously spreads to almost the entire area. This bonding is performed under the action of the Van der Waals force or hydrogen bonding and can be performed at room temperature.

Note that before the single crystal semiconductor substrate 510 and the base substrate 500 are bonded to each other, the surfaces to be bonded to each other are preferably subjected to surface treatment. Surface treatment can improve the bonding strength at the interface between the single crystal semiconductor substrate 510 and the base substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 514 does not occur (e.g., a temperature higher than or equal to room temperature and lower than 400° C.). Alternatively, the nitrogen-containing layer 502 and the oxide film 512 may be bonded while being heated at a temperature in this range. The heat treatment can be performed using a diffusion furnace, a heating furnace such as a resistance heating furnace, a rapid thermal annealing (RTA) apparatus, a microwave heating apparatus, or the like. Note that the above temperature condition is merely an example, and one embodiment of the disclosed invention should not be construed as being limited to this example.

Figure 8G:
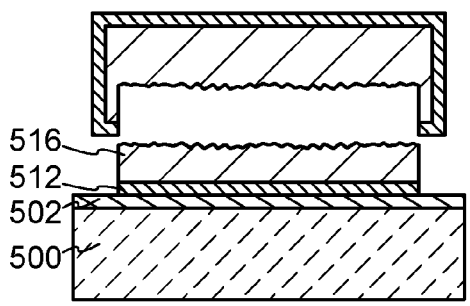

Next, heat treatment is performed for separation of the single crystal semiconductor substrate 510 at the embrittled region, whereby a single crystal semiconductor layer 516 is formed over the base substrate 500 with the nitrogen-containing layer 502 and the oxide film 512 interposed therebetween (see FIG. 8G).

Note that the temperature for heat treatment in the separation is desirably set as low as possible. This is because the lower the temperature in the separation is, the more surface roughness of the single crystal semiconductor layer 516 can be suppressed. Specifically, the temperature of the heat treatment in the separation may be 300° C. to 600° C. inclusive and the heat treatment is more effective when the temperature is 400° C. to 500° C. inclusive.

Note that after the single crystal semiconductor substrate 510 is separated, the single crystal semiconductor layer 516 may be subjected to heat treatment at 500° C. or higher so that the concentration of hydrogen remaining in the single crystal semiconductor layer 516 may be reduced.

Figure 8H:
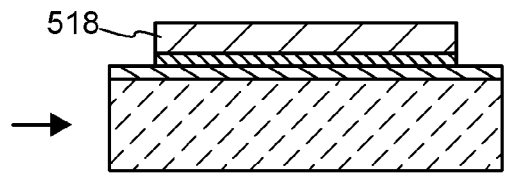

Then, the surface of the single crystal semiconductor layer 516 is irradiated with laser light, whereby a single crystal semiconductor layer 518 in which the planarity of the surface is improved and the number of defects is reduced is formed (see FIG. 8H). Note that instead of the laser light irradiation treatment, heat treatment may be performed.

Although the irradiation treatment with the laser light is performed immediately after the heat treatment for separation of the single crystal semiconductor layer 516 in this embodiment, one embodiment of the present invention is not construed as being limited to this. The laser light irradiation treatment may be performed after the heat treatment for separating the single crystal semiconductor layer 516 and etching treatment for removing a surface region having many defects of the single crystal semiconductor layer 516. Alternatively, the laser light irradiation treatment may be performed after the surface planarity of the single crystal semiconductor layer 516 is improved. Note that the etching treatment may be either wet etching or dry etching. Further, in this embodiment, after the above laser light irradiation, a step of reducing the thickness of the single crystal semiconductor layer 516 may be performed. In order to reduce the thickness of the single crystal semiconductor layer 516, either or both of dry etching and wet etching may be employed.

Through the above steps, an SOI substrate having the single crystal semiconductor layer 518 with favorable characteristics can be obtained (see FIG. 8H).

<Method for Manufacturing Semiconductor Device>

Next, a method for manufacturing a semiconductor device with the use of the SOI substrate, in particular, a method for manufacturing the transistor 560 will be described with reference to FIGS. 9A to 9E. Note that FIGS. 9A to 9E illustrate part of the SOI substrate formed by the method illustrated in FIGS. 8A to 8H, and are cross-sectional views corresponding to part of FIG. 7A.

First, the single crystal semiconductor layer 518 is processed into an island shape to form a semiconductor layer 520 (see FIG. 9A). Note that before or after this step, an impurity element imparting n-type conductivity or p-type conductivity may be added to the semiconductor layer in order to control the threshold voltage of the transistor. When the semiconductor material included in the substrate is silicon, phosphorus, arsenic, or the like can be used as the impurity imparting n-type conductivity, and boron, aluminum, gallium, or the like can be used as the impurity imparting p-type conductivity.

Next, an insulating layer 522 is formed to cover the semiconductor layer 520, and a conductive layer 524 is formed over the insulating layer 522 in a region overlapping with the semiconductor layer 520 (see FIG. 9B).

The insulating layer 522 is to be processed into a gate insulating layer later. The insulating layer 522 can be formed by heat treatment (thermal oxidation treatment, thermal nitridation treatment, or the like) on the surface of the semiconductor layer 520, for example. High-density plasma treatment may be employed instead of heat treatment. The high-density plasma treatment can be performed using, for example, a mixed gas of any of a rare gas such as He, Ar, Kr, or Xe, oxygen, nitrogen oxide, ammonia, nitrogen, hydrogen, and the like. Needless to say, the insulating layer may be formed by a CVD method, a sputtering method, or the like. The insulating layer preferably has a single-layer structure or a stacked-layer structure which includes film including silicon oxide, silicon oxynitride, silicon nitride, hafnium oxide, aluminum oxide, tantalum oxide, yttrium oxide, hafnium silicate ($HfSi_xO_y$, (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)) to which nitrogen is added, and the like. The insulating layer can have a thickness of, for example, 1 nm to 100 nm inclusive, preferably 10 nm to 50 nm inclusive. Here, a single layer of an insulating layer containing silicon oxide is formed by a plasma CVD method.

The conductive layer 524 is to be processed into a gate insulating layer later. The conductive layer 524 can be formed using a metal material such as aluminum, copper, titanium, tantalum, or tungsten. Further, the layer including a conductive material may be formed using a semiconductor material such as polycrystalline silicon. There is no particular limitation on the method for forming the layer including a conductive material, and any of a variety of film formation methods such as an evaporation method, a CVD method, a sputtering method, and a spin coating method can be employed. Note that in this embodiment, an example where the layer including a conductive material is formed using a metal material is described.

Then, the insulating layer 522 and the conductive layer 524 are selectively etched, whereby the gate insulating layer 522a and the gate electrode 524a are formed over the semiconductor layer 520 (see FIG. 9C). As the etching, dry etching is preferably performed, but wet etching may be performed. An etching gas and an etchant can be selected as appropriate in accordance with a material to be etched.

Then, an impurity element imparting one conductivity type is added to the semiconductor layer 520 using the gate electrode 524a as a mask, whereby the channel formation region 526 and the impurity region 528 are formed (see FIG. 9D). Note that phosphorus (P) or arsenic (As) is added here in order to form an n-channel transistor; an impurity element such as boron (B), aluminum (Al), or gallium (Ga) may be added when a p-channel transistor is formed. Here, the concentration of impurity to be added can be set as appropriate. In addition, heat treatment for activation is performed after the impurity element is added.

Note that when the semiconductor layer 520 is formed using a material containing silicon, a silicide region may be formed by forming silicide in part of the semiconductor layer 520 in order to further reduce the resistance of the source region and the drain region. The silicide region is formed in such a manner that metal is brought into contact with the semiconductor layer, and silicon in the semiconductor layer is made to react with the metal by heat treatment (e.g., a GRTA method, an LRTA method, or laser irradiation). As the silicide, for example, cobalt silicide or nickel silicide may be used. In the case where the semiconductor layer 520 is thin, silicide reaction may proceed to a bottom of the semiconductor layer 520. As examples of a metal material used for forming silicide, titanium, tungsten, molybdenum, zirconium, hafnium, tantalum, vanadium, neodymium, chromium, platinum, palladium, and the like can be given in addition to cobalt and nickel.

Then, the electrode 530 is formed in a region which is in contact with part of the impurity region 528. After that, the insulating layer 534 is formed to cover the components formed in the above steps (see FIG. 9E).

The electrode 530 is formed by, for example, forming a layer including a conductive material and then selectively etching the layer. The layer including a conductive material can be formed using a metal material such as aluminum, copper, titanium, tantalum, or tungsten. Further, the layer including a conductive material may be formed using a semiconductor material such as polycrystalline silicon. There is no particular limitation on the method for forming the layer including a conductive material, and any of a variety of film formation methods such as an evaporation method, a CVD method, a sputtering method, and a spin coating method can be employed.

Alternatively, the electrode 530 can be formed by forming an opening reaching the impurity region 528 in the insulating layer 534 after the formation of the insulating layer 534 and then by filling the opening.

The insulating layer 534 can be formed using a material including an inorganic insulating material such as silicon oxide, silicon oxynitride, silicon nitride, or aluminum oxide. It is particularly preferable to use a low dielectric constant (low-k) material for the insulating layer 534 because capacitance due to overlap of electrodes or wirings can be sufficiently reduced. Note that the insulating layer 534 may be a porous insulating layer formed using any of those materials. The porous insulating layer has a lower dielectric constant than an insulating layer with high density, and thus allows a further reduction in capacitance generated by electrodes or wirings. Alternatively, the insulating layer 534 can be formed using an organic insulating material such as polyimide or acrylic. Note that although the insulating layer 534 has a stacked-layer structure here, one embodiment of the disclosed invention is not limited to this. The insulating layer may have a single-layer structure or a stacked-layer structure including three or more layers.

Through the above steps, the transistor 560 is formed using the SOI substrate (see FIG. 9E). The transistor 560 including a material which is not an oxide semiconductor is capable of high-speed operation. Thus, when the transistor 560 is used as a read transistor, the reading speed can be increased. Further, a logic circuit (also referred to as an arithmetic circuit) or the like can be formed using the transistor 560.

Then, CMP treatment is performed on the insulating layer 534 to expose upper surfaces of the gate electrode 524a and the electrode 530 (not illustrated). As treatment for exposing the upper surfaces of the gate electrode 524a and the electrode 530, etching treatment or the like can also be employed as well as CMP treatment; in order to improve characteristics of the transistor 562 which is formed later, the surfaces of the insulating layer 534 is preferably made as flat as possible.

Note that before or after each of the above steps, a step of forming an electrode, a wiring, a semiconductor layer, an insulating layer, or the like may be further performed. For example, the wiring may have a multi-layer structure including a stack of an insulating layer and a conductive layer to provide a highly integrated semiconductor device.

After that, the transistor 562 and the capacitor 564 which are electrically connected to the transistor 560 are formed (see FIG. 7A). Since manufacturing methods of the transistor 562 and the capacitor 564 are similar to that of the transistor 162 and the capacitor 164, the description is omitted here. The above embodiments can be referred to for details of the manufacturing methods.

Modification Example

Next, another structure of the semiconductor device in FIGS. 7A and 7B will be described with reference to FIGS. 10A and 10B.

<Cross-Sectional Structure and Planar Structure of Semiconductor Device>

Figure 10A:
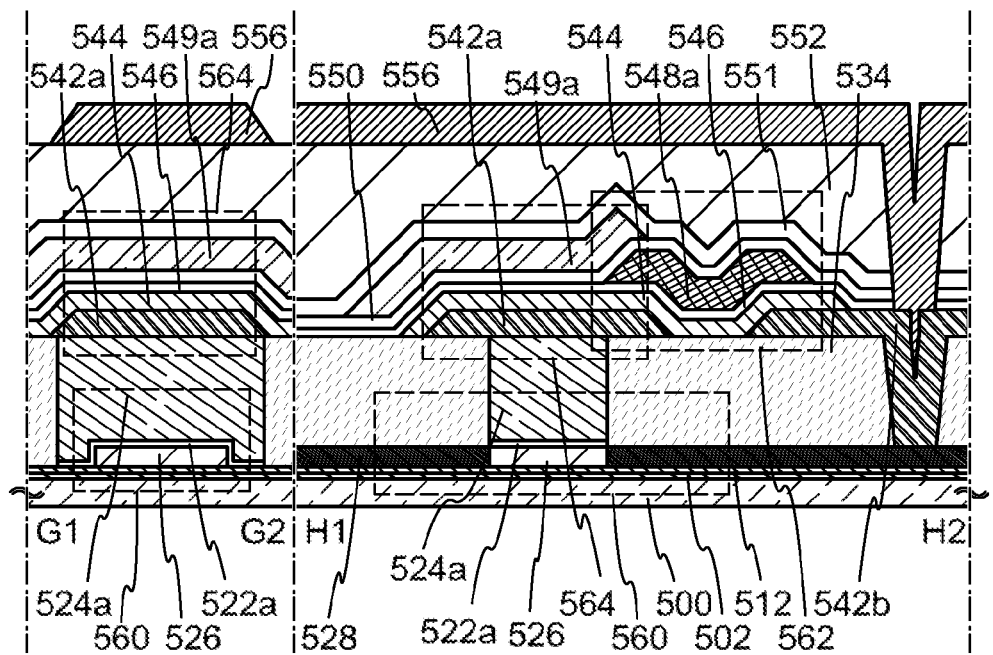
FIGS. 10A and 10B are a cross-sectional view and a plan view of a semiconductor device.
Figure 10B:
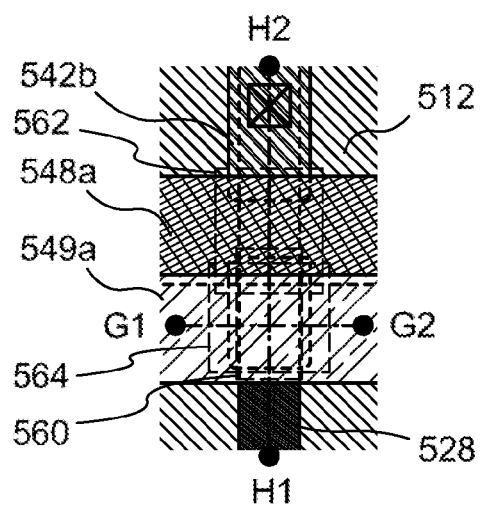

FIG. 10A is a cross-sectional view of the semiconductor device, and FIG. 10B is a plan view of the semiconductor device. Here, FIG. 10A illustrates a cross section taken along line G1-G2 and line H1-H2 in FIG. 10B. The semiconductor device illustrated in FIGS. 10A and 10B, like the semiconductor device illustrated in FIGS. 7A and 7B, includes the transistor 560 including a first semiconductor material in the lower portion, and the transistor 562 including a second semiconductor material in the upper portion. Here, it is preferable that the first semiconductor material and the second semiconductor material be different from each other. For example, the first semiconductor material can be a material (silicon) which is not an oxide semiconductor and the second semiconductor material can be an oxide semiconductor. A transistor including a semiconductor material (e.g., single crystal silicon) which is not an oxide semiconductor can easily operate at high speed. On the other hand, a transistor including an oxide semiconductor can hold charge for a long time owing to its characteristics.

One of the differences between the semiconductor device in FIGS. 10A and 10B and the semiconductor device in FIGS. 7A and 7B is a method of connecting the transistor 560 to the transistor 562. In the semiconductor device in FIGS. 7A and 7B, the electrode 530 is formed in a region in contact with part of the impurity region 528, and the impurity region 528 of the transistor 560 in the lower portion and the source or drain electrode 542*b* of the transistor 562 in the upper portion are electrically connected to each other through the electrode 530. In contrast, in the semiconductor device in FIGS. 10A and 10B, the source or drain electrode 542*b* of the transistor 562 in the upper portion is directly in contact with the impurity region 528 of the transistor 560 in the lower portion.

Another difference between the semiconductor device in FIGS. 10A and 10B and the semiconductor device in FIGS. 7A and 7B is a method of connecting the transistor 562 and the wiring 556 in the upper portion. In the semiconductor device in FIGS. 7A and 7B, the electrode 554 in contact with the source or drain electrode 542*b* is formed, and the source or drain electrode 542*b* of the transistor 562 and the wiring 556 are electrically connected to each other through the electrode 554. In contrast, in the semiconductor device in FIGS. 10A and 10B, the wiring 556 is directly in contact with the source or drain electrode 542*b* of the transistor 562.

The transistor 560 in FIGS. 10A and 10B is the same as the transistor 560 in FIGS. 7A and 7B. The transistor 562 in FIGS. 10A and 10B is the same as the transistor 562 in FIGS. 7A and 7B. Moreover, the capacitor 564 in FIGS. 10A and 10B is the same as the capacitor 564 in FIGS. 7A and 7B. The above embodiment can be referred to for details.

For the manufacturing method of the semiconductor device in FIGS. 10A and 10B, particularly, the manufacturing method of the source or drain electrode of the transistor 562 in the upper portion and the manufacturing method of the wiring 556, the above embodiments can be referred to; thus, detailed description thereof is omitted.

The structures, methods, and the like described in this embodiment can be combined as appropriate with any of the structures and methods described in the other embodiments.

Embodiment 3

In this embodiment, a structure and a manufacturing method of a semiconductor device according to another embodiment of the disclosed invention will be described with reference to FIGS. 11A and 11B and FIGS. 12A and 12B.

<Cross-Sectional Structure and Planar Structure of Semiconductor Device>

Figure 11A:
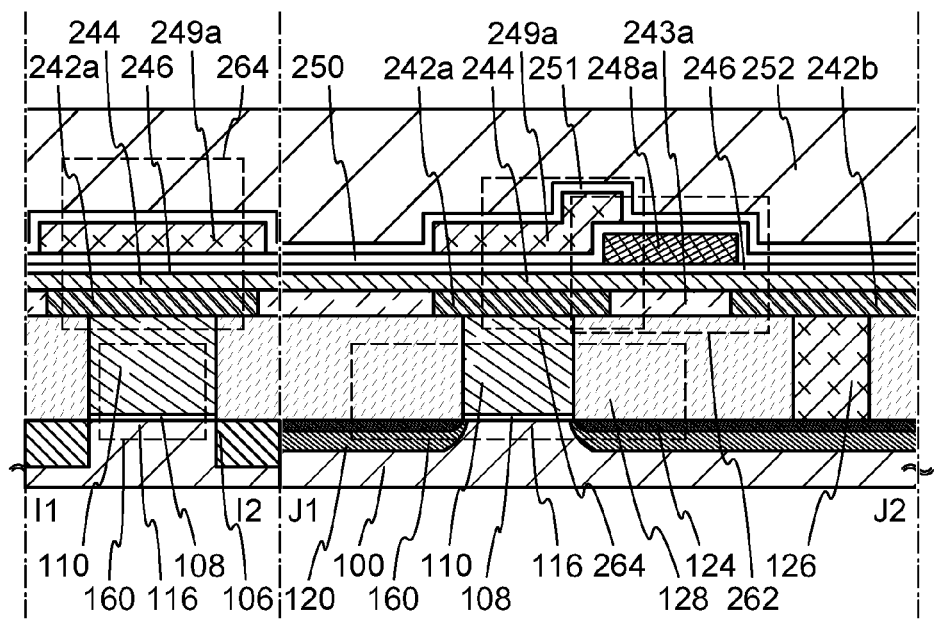
FIGS. 11A and 11B are a cross-sectional view and a plan view of a semiconductor device.
Figure 11B:
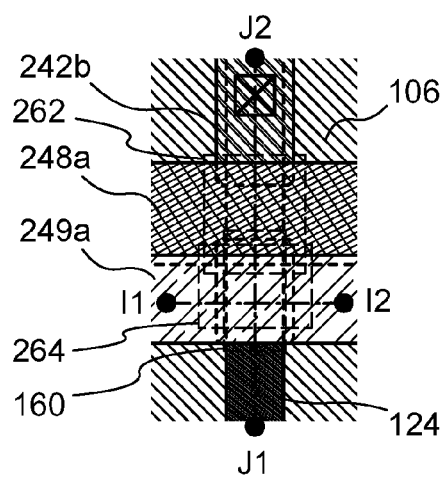

FIGS. 11A and 11B illustrate an example of a structure of the semiconductor device according to this embodiment. FIG. 11A is a cross-sectional view of the semiconductor device, and FIG. 11B is a plan view of the semiconductor device. Here, FIG. 11A illustrates a cross section taken along line I1-I2 and line J1-J2 in FIG. 11B. The semiconductor device illustrated in FIGS. 11A and 11B includes the transistor 160 including a first semiconductor material in the lower portion, and a transistor 262 including a second semiconductor material in the upper portion. Here, it is preferable that the first semiconductor material and the second semiconductor material be different from each other. For example, the first semiconductor material can be a material (silicon) which is not an oxide semiconductor and the second semiconductor material can be an oxide semiconductor. A transistor including a semiconductor material (e.g., single crystal silicon) which is not an oxide semiconductor can easily operate at high speed. On the other hand, a transistor including an oxide semiconductor can hold charge for a long time owing to its characteristics.

While the transistor 160 in FIGS. 1A and 1B is employed as the transistor in the lower portion in FIGS. 11A and 11B, the transistor 560 in FIGS. 7A and 7B can alternatively be employed. Since the structure of the transistor 262 in the upper portion in the FIGS. 11A and 11B is different from that of the transistor 162 in the above embodiments, the transistor 262 is described in detail.

The transistor 262 in FIGS. 11A and 11B includes, over the insulating layer 128, an insulating layer 243*a*, a source or drain electrode 242*a* and a source or drain electrode 242*b* which are embedded in the insulating layer 243*a*, an oxide semiconductor layer 244 in contact with a top surface of the insulating layer 243*a* and parts of top surfaces of the source or drain electrode 242*a* and the source or drain electrode 242*b*, a gate insulating layer 246 covering the oxide semiconductor layer 244, and a gate electrode 248*a* over the gate insulating layer 246.

In addition, part of the upper surface of the insulating layer 243*a* (particularly, a region parallel to the surface where components are formed), which is in contact with the oxide semiconductor layer 244, has a root-mean-square (RMS) roughness of 1 nm or less. The difference in height between the part of the upper surface of the insulating layer 243*a* and the upper surface of the source or drain electrode 242*a* or the difference in height between the part of the upper surface of the insulating layer 243*a* and the upper surface of the source or drain electrode 242*b* is less than 5 nm.

As described above, in one embodiment of the disclosed invention, a channel formation region of the transistor 262 is provided over a highly flat region with a root-mean-square (RMS) roughness of 1 nm or less. Accordingly, even when the transistor 262 is miniaturized, a problem such as a short-channel effect can be prevented; thus, the transistor 262 with favorable characteristics can be provided.

In addition, the oxide semiconductor layer 244 can have a uniform thickness by improving the planarity of the surface where the oxide semiconductor layer 244 is formed; thus, the transistor 262 can have improved characteristics. Furthermore, a decrease in coverage which may be caused by a large difference in height can be suppressed, and a break due to a step (disconnection) or a defective connection of the oxide semiconductor layer 244 can be prevented.

<Method for Manufacturing Transistor in Upper Portion>

Next, a manufacturing method of the semiconductor device will be described with reference to FIGS. 12A to 12F. Here, FIGS. 12A to 12F illustrate an example of a manufacturing method of the transistor 262 shown in FIGS. 11A and 11B. Note that FIGS. 2A to 2D and FIGS. 3A to 3D may be referred to for the manufacturing method of the transistor 160 in the lower portion and detailed description thereof is omitted.

Figure 12A:
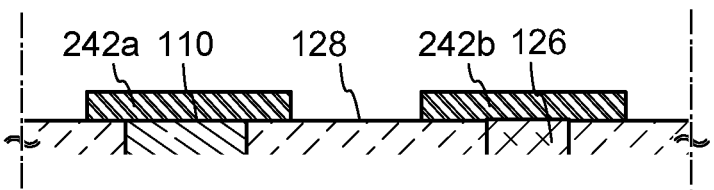
FIGS. 12A to 12F are cross-sectional views illustrating a manufacturing process of a semiconductor device.
Figure 12B:
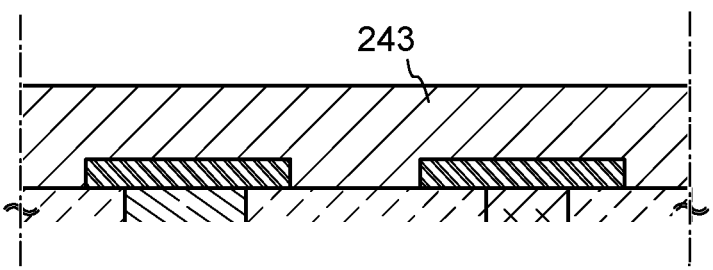

A conductive layer is formed over the insulating layer 128, the gate electrode 110, the electrode 126, and the like and the conductive layer is selectively etched to form the source or drain electrode 242a and the source or drain electrode 242b (see FIG. 12A). Then, an insulating layer 243 is formed to cover the source or drain electrode 242a and the source or drain electrode 242b (see FIG. 12B). The above embodiments can be referred to for materials and forming methods of the source or drain electrode 242a, the source or drain electrode 242b, and the insulating layer 243 and detailed description thereof is omitted.

Note that, as a treatment before the formation of the source or drain electrodes 242a and 242b, CMP treatment is preferably performed on the insulating layer 128 to expose upper surfaces of the gate electrode 110 and the electrode 126. As treatment for exposing the upper surfaces of the gate electrode 110 and the electrode 126, etching treatment or the like can also be employed as well as CMP treatment; in order to improve characteristics of the transistor 262, the surface of the insulating layer 128 is preferably made as flat as possible.

Figure 12C:
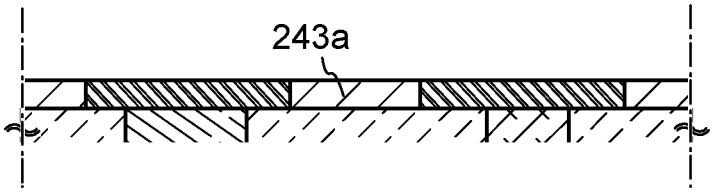

Then, the insulating layer 243a is formed by thinning the insulating layer 243 by CMP treatment (see FIG. 12C). Here, the CMP treatment is performed under such conditions that the surfaces of the source or drain electrodes 242a and 242b become exposed. In addition, the CMP treatment is performed under such conditions that the root-mean-square (RMS) roughness of a surface of the insulating layer 243a becomes 1 nm or less (preferably 0.5 nm or less). By the CMP treatment performed under such conditions, the planarity of a surface where the oxide semiconductor layer 244 is formed later can be improved, and the characteristics of the transistor 262 can be improved.

Note that the CMP treatment may be performed only once or plural times. When the CMP treatment is performed plural times, it is preferable that the first polishing be performed at a high polishing rate and the final polishing be performed at a low polishing rate. By performing polishing at different polishing rates, the planarity of the surface of the insulating layer 243a can be further improved.

By the CMP treatment described above, the difference in height between the part of the upper surface of the insulating layer 243a and the upper surface of the source or drain electrode 242a or the difference in height between the part of the upper surface of the insulating layer 243a and the upper surface of the source or drain electrode 242b can be set to less than 5 nm.

Figure 12D:
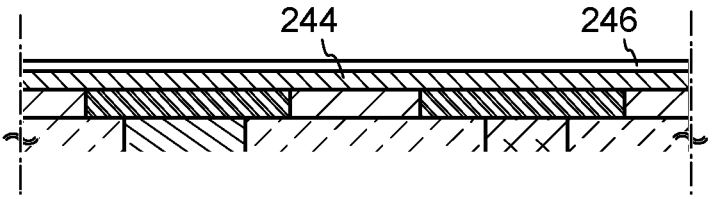
Figure 12E:
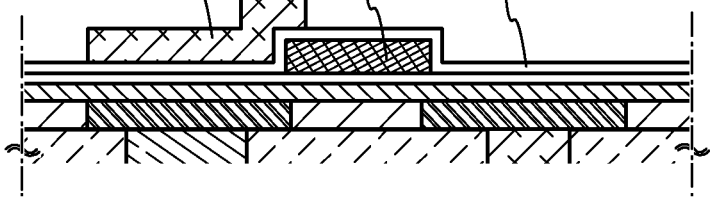

Next, the oxide semiconductor layer 244 covering the above-described surface is formed in contact with part of the source or drain electrodes 242a and 242b and the insulating layer 243a; then, the gate insulating layer 246 is formed so as to cover the oxide semiconductor layer 244 (see FIG. 12D).

Note that a surface where the oxide semiconductor layer 244 is formed is sufficiently planarized in one embodiment of the present invention. Therefore, even an oxide semiconductor layer having a small thickness can be favorably formed. In addition, in one embodiment of the present invention, the oxide semiconductor layer 244 preferably has a flat cross-sectional shape, as illustrated in FIG. 12D. In the case where the oxide semiconductor layer 244 has a flat cross-sectional shape, whereby leakage current can be reduced, as compared with the case where the oxide semiconductor layer 244 does not have a flat cross-sectional shape.

Then, after the gate electrode 248a is formed over the gate insulating layer 246, an insulating layer 250 is formed to cover the gate electrode 248a. Then, an electrode 249a is formed over the insulating layer 250 (see FIG. 12E).

The electrode 249a of a capacitor 264 is provided to overlap with at least part of the gate electrode 248a of the transistor 262. Further, the electrode 249a of the capacitor 264 may be provided to overlap with at least part of the gate electrode 110 of the transistor 160. Further, the electrode 249a of the capacitor 264 may be provided to overlap with at least part of a channel formation region of the transistor 262. Such a planar layout allows higher integration.

Figure 12F:
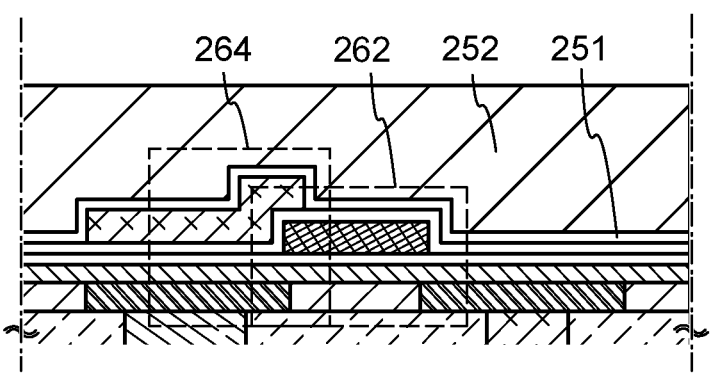

Then, an insulating layer 251 is formed to cover the insulating layer 250 and the electrode 249a, and an insulating layer 252 is formed over the insulating layer 251 (see FIG. 12F).

Through the above steps, the transistor 262 can be formed (see FIG. 12F).

The structures, methods, and the like described in this embodiment can be combined as appropriate with any of the structures and methods described in the other embodiments.

Embodiment 4

In this embodiment, a circuit structure and operation of a semiconductor device according to one embodiment of the disclosed invention will be described with reference to FIGS. 13A, 13B, and 13C. In the description of the circuit diagrams in FIGS. 13A, 13B, and 13C, reference numerals are the same as those in the semiconductor device in FIGS. 1A and 1B. Note that in circuit diagrams, "OS" is written beside a transistor in order to indicate that the transistor includes an oxide semiconductor.

Figure 13A:
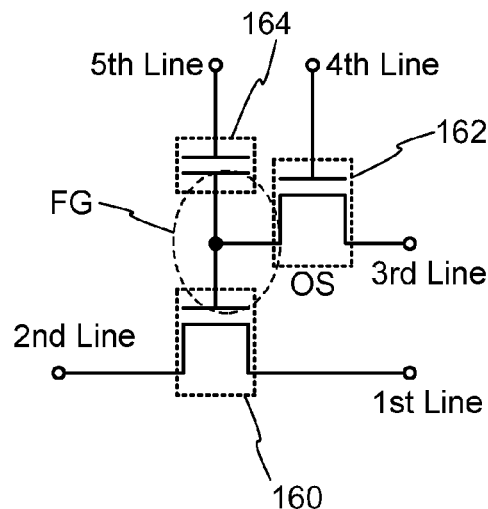
FIGS. 13A, 13B, and 13C are circuit diagrams of semiconductor devices.

In the semiconductor device in FIG. 13A, a first wiring (a 1st line) and a source electrode of a transistor 160 are electrically connected to each other, and a second wiring (a 2nd line) and a drain electrode of the transistor 160 are electrically connected to each other. A third wiring (a 3rd line) and one of source or drain electrodes of the transistor 162 are electrically connected to each other, and a fourth wiring (a 4th line) and a gate electrode of the transistor 162 are electrically connected to each other. A gate electrode of the transistor 160 and the other of the source or drain electrodes of the transistor 162 are electrically connected to one electrode of the capacitor 164, and a fifth wiring (a 5th line) and the other electrode of the capacitor 164 are electrically connected to each other.

Here, the above transistor including an oxide semiconductor is used as the transistor 162, for example. Off-state current of a transistor including an oxide semiconductor is extremely small. Therefore, when the transistor 162 is in an off state, a potential in the gate electrode of the transistor 160 can be held for a very long time. By providing the capacitor 164, charge supplied to the gate electrode of the transistor 160 can be easily held and held data can be easily read.

Note that there is no particular limitation on the transistor 160. In order to increase the speed of reading data, it is preferable to use, for example, a transistor with high switching speed, such as a transistor formed using single crystal silicon.

Figure 13B:
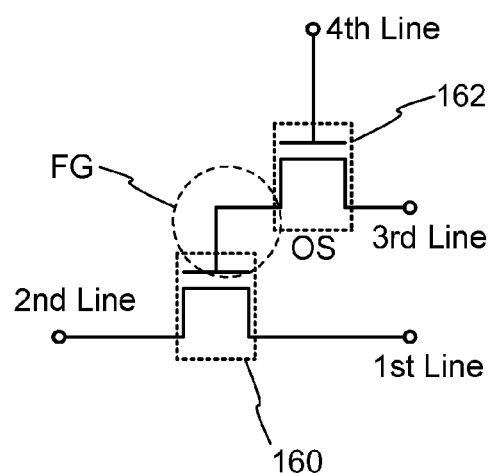

Alternatively, the capacitor 164 may be omitted as in FIG. 13B.

The semiconductor device in FIG. 13A can write, hold, and read data as described below, utilizing a characteristic in which the potential of the gate electrode of the transistor 160 can be held.

Firstly, writing and holding of data will be described. The potential of the fourth wiring is set to a potential at which the transistor 162 is turned on, whereby the transistor 162 is turned on. Thus, the potential of the third wiring is applied to the gate electrode of the transistor 160 and the capacitor 164. That is, predetermined charge is applied to the gate electrode of the transistor 160 (writing of data). Here, charge for applying either two different levels of potential (hereinafter, charge for applying a low potential is referred to as charge $Q_L$ and charge for applying a high potential is referred to as charge $Q_H$) is applied through the third wiring. Note that charge for applying three or more different levels of potential may be employed to improve storage capacity. After that, the potential of the fourth wiring is set to a potential at which the transistor 162 is turned off, whereby the transistor 162 is turned off. Thus, the charge applied to the gate electrode of the transistor 160 is held (holding of data).

Since the off-state current of the transistor 162 is significantly small, the charge of the gate electrode of the transistor 160 is held for a long time.

Secondly, reading of data will be described. While a predetermined potential (a fixed potential) is applied to the first wiring, an appropriate potential (a read-out potential) is applied to the fifth wiring, whereby the potential of the second wiring changes depending on the amount of charge held in the gate electrode of the transistor 160. This is because in general, when the transistor 160 is an n-channel transistor, an apparent threshold value $V_{th\_H}$ in the case where $Q_H$ is applied to the gate electrode of the transistor 160 is lower than an apparent threshold value $V_{th\_L}$ in the case where $Q_L$ is applied to the gate electrode of the transistor 160. Here, an apparent threshold value refers to the potential of the fifth wiring which is needed to turn on the transistor 160. Thus, by setting the potential of the fifth wiring to a potential $V_0$ which is between $V_{th\_H}$ and $V_{th\_L}$, charge applied to the gate electrode of the transistor 160 can be determined. For example, in the case where $Q_H$ is applied in writing, when the potential of the fifth wiring is set to $V_0$ ($>V_{th\_H}$), the transistor 160 is turned on. In the case where $Q_L$ is applied in writing, even when the potential of the fifth wiring is set to $V_0$ ($<V_{th\_L}$), the transistor 160 remains off. Thus, the held data can be read by measuring the potential of the second wiring.

Note that in the case where memory cells are arrayed, it is necessary to read out data only from a predetermined memory cell. In the case where data of the predetermined memory cell is read out and data of the other memory cells is not read out, a potential at which the transistor 160 is in an off state regardless of the state of the gate electrode, that is, a potential lower than $V_{th\_H}$, may be applied to the fifth wirings of the memory cells whose data is not to be read. Alternatively, a potential at which the transistor 160 is in an on state regardless of the state of the gate electrode, that is, a potential higher than $V_{th\_L}$, may be applied to the fifth wirings of the memory cells whose data is not to be read.

Thirdly, rewriting of data will be described. Rewriting of data is performed in a manner similar to that of writing and holding of data. That is, the potential of the fourth wiring is set to a potential at which the transistor 162 is turned on, whereby the transistor 162 is turned on. Accordingly, the potential of the third wiring (a potential for new data) is applied to the gate electrode of the transistor 160 and the capacitor 164. After that, the potential of the fourth wiring is set to a potential at which the transistor 162 is turned off, whereby the transistor 162 is turned off. Thus, charge for the new data is applied to the gate electrode of the transistor 160.

In the semiconductor device according to the disclosed invention, data can be directly rewritten by another writing of data as described above. Therefore, extraction of charge from a floating gate with the use of high voltage, which is needed in a flash memory or the like, is not needed and a reduction in operation speed caused by erasing operation can be suppressed. In other words, high-speed operation of the semiconductor device can be realized.

Note that the source electrode or the drain electrode of the transistor 162 is electrically connected to the gate electrode of the transistor 160, and thereby has an effect similar to that of a floating gate of a floating-gate transistor which is used as a non-volatile memory element. The portion where the source electrode or the drain electrode of the transistor 162 and the gate electrode of the transistor 160 are electrically connected to each other is therefore called a floating gate portion FG in some cases. When the transistor 162 is off, the floating gate portion FG can be regarded as being embedded in an insulator and electric charge is held in the floating gate portion FG. The off-state current of the transistor 162 including an oxide semiconductor is smaller than or equal to one hundred thousandth of the off-state current of a transistor including a silicon semiconductor or the like; thus, loss of the charge accumulated in the floating gate portion FG due to leakage current of the transistor 162 is negligible. That is, with the transistor 162 including an oxide semiconductor, a non-volatile memory device which can hold data without power supply can be realized.

For example, when the off-state current of the transistor 162 is smaller than or equal to 10 zA (1 zA (zeptoampere) is $1 \times 10^{-21}$ A) at room temperature (25° C.) and the capacitance value of the capacitor 164 is approximately 10 fF, data can be held for $10^4$ seconds or longer. Note that it should be appreciated that the holding time changes depending on the transistor characteristics and the capacitance value.

Further, in this case, a problem of degradation of a gate insulating film (a tunnel insulating film), which occurs in a conventional floating-gate transistor, does not exist. That is, the problem of degradation of a gate insulating film due to injection of electrons into a floating gate, which is a conventional problem, can be solved. This means that there is no limit on the number of times of writing in principle. Furthermore, high voltage needed for writing or erasing in a conventional floating-gate transistor is not necessary.

Figure 13C:
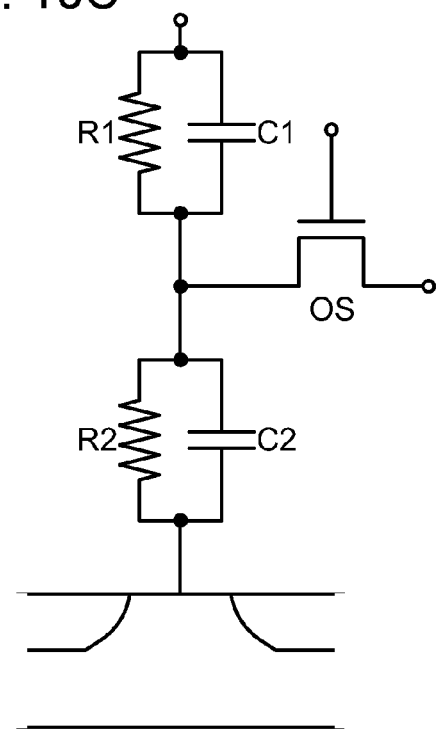

The components such as transistors in the semiconductor device in FIG. 13A can be regarded as including a resistor and a capacitor as shown in FIG. 13C. That is, in FIG. 13C, the transistor 160 and the capacitor 164 are each regarded as including a resistor and a capacitor. R1 and C1 denote the resistance value and the capacitance value of the capacitor 164, respectively. The resistance value R1 corresponds to the resistance value of an insulating layer included in the capacitor 164. R2 and C2 denote the resistance value and the capacitance value of the transistor 160, respectively. The resistance value R2 corresponds to the resistance value of a gate insulating layer at the time when the transistor 160 is on. The capacitance value C2 corresponds to the capacitance value of so-called gate capacitance (capacitance between the gate electrode and the source electrode or drain electrode and capacitance between the gate electrode and the channel formation region).

A charge holding period (also referred to as a data holding period) is determined mainly by the off-state current of the transistor 162 under the condition where gate leakage current of the transistor 162 is sufficiently small, and R1≥ROS (R1 is greater than or equal to ROS) and R2≥ROS (R2 is greater than or equal to ROS), where ROS is the resistance (also referred to as effective resistance) between the source electrode and the drain electrode when the transistor 162 is off.

On the other hand, in the case where the above conditions are not satisfied, it is difficult to ensure a sufficient holding period even if the off-state current of the transistor 162 is sufficiently small. This is because leakage current other than the off-state current of the transistor 162 (e.g., leakage current generated between the source electrode and the gate electrode of the transistor 160) would be large. Thus, it can be said that the semiconductor device disclosed in this embodiment desirably satisfies the above relation.

Meanwhile, it is desirable that C1≥C2 (C1 is greater than or equal to C2). This is because by increasing C1, the potential of the fifth wiring can be effectively applied to the floating gate portion FG when the potential in the floating gate portion FG is controlled by the fifth wiring, and the difference between the potentials applied to the fifth wiring (e.g., a potential of reading and a potential of not reading) can be small.

When the above relations are satisfied, a more preferable semiconductor device can be realized. Note that R1 and R2 depend on the gate insulating layer of the transistor 160 and the insulating layer of the capacitor 164. The same applies to C1 and C2. Therefore, the material, the thickness, and the like of the gate insulating layer are preferably set as appropriate to satisfy the above relationships.

In the semiconductor device described in this embodiment, the floating gate portion FG has an effect similar to that of a floating gate of a floating-gate transistor of a flash memory or the like, but the floating gate portion FG of this embodiment has a feature which is essentially different from that of the floating gate of the flash memory or the like. In a flash memory, since voltage applied to a control gate is high, it is necessary to keep a proper distance between cells in order to prevent the potential from affecting a floating gate of the adjacent cell. This is one of the factors inhibiting high integration of the semiconductor device. The factor is due to a basic principle of a flash memory that tunneling current is generated by application of a high electric field.

In contrast, the semiconductor device according to this embodiment is operated by switching of a transistor including an oxide semiconductor and does not use the above principle of charge injection by tunneling current. That is, unlike a flash memory, a high electric field for charge injection is not necessary. Accordingly, an effect of a high electric field for a control gate on an adjacent cell does not need to be taken into account; thus, high integration can be facilitated.

In addition, it is also advantage over a flash memory that a high electric field is unnecessary and a large peripheral circuit (such as a booster circuit) is unnecessary. For example, the highest voltage applied to the memory cell according to this embodiment (the difference between the highest potential and the lowest potential which are applied to terminals of the memory cell at the same time) can be 5 V or lower, preferably 3 V or lower, in each memory cell in the case where data of two levels (one bit) is written.

In the case where the dielectric constant ∈r1 of the insulating layer included in the capacitor 164 is different from the dielectric constant ∈r2 of the gate insulating layer included in the transistor 160, it is easy to satisfy the relation that C1≥C2 (C1 is greater than or equal to C2) while 2×S2≥S1 (2×S2 is greater than or equal to S1), desirably, S2 S1 (S2 is greater than or equal to S1) where S1 is the area of the capacitor 164 and S2 is the area having the gate capacitance in the transistor 160. Specifically, for example, when a film formed of a high-k material such as hafnium oxide or a stack of a film formed of a high-k material such as hafnium oxide and a film formed of an oxide semiconductor is used for the insulating layer included in the capacitor 164, ∈r1 can be set to 10 or more, preferably 15 or more, and when a film formed of silicon oxide is used for the gate insulating layer included in the transistor 160, 3≤∈r2≤4 (∈r2 is 3 to 4 inclusive).

A combination of such structures enables further higher integration of the semiconductor device according to the disclosed invention.

Note that in addition to higher integration, a multilevel technique can be employed in order to increase the storage capacity of the semiconductor device. For example, three or more levels of data are written to one memory cell, whereby the storage capacity can be increased as compared to the case where two-level data is written. The multilevel technique can be achieved by, for example, supplying charge Q to the gate electrode of the transistor 160, in addition to charge $Q_L$ for supplying a low potential and charge $Q_H$ for supplying a high potential. In this case, enough storage capacity can be ensured even when a circuit structure in which $F^2$ is not sufficiently small is employed.

Note that an n-channel transistor (an n-type transistor) in which electrons are majority carriers is used in the above description, but it will be appreciated that a p-channel transistor in which holes are majority carriers can be used instead of the n-channel transistor.

As described above, the semiconductor device according to this embodiment is suitable for increasing the degree of integration. Note that according to one embodiment of the disclosed invention, a wiring serves as plural components and the contact area is reduced; thus, a semiconductor device in which the degree of integration is further increased can be provided.

The structures, methods, and the like described in this embodiment can be combined as appropriate with any of the structures and methods described in the other embodiments.

Embodiment 5

In this embodiment, an application example of the semiconductor device described in the above embodiments will be described. Specifically, an example of a semiconductor device in which the semiconductor devices described in the above embodiments are arranged in a matrix will be described.

Figure 14:
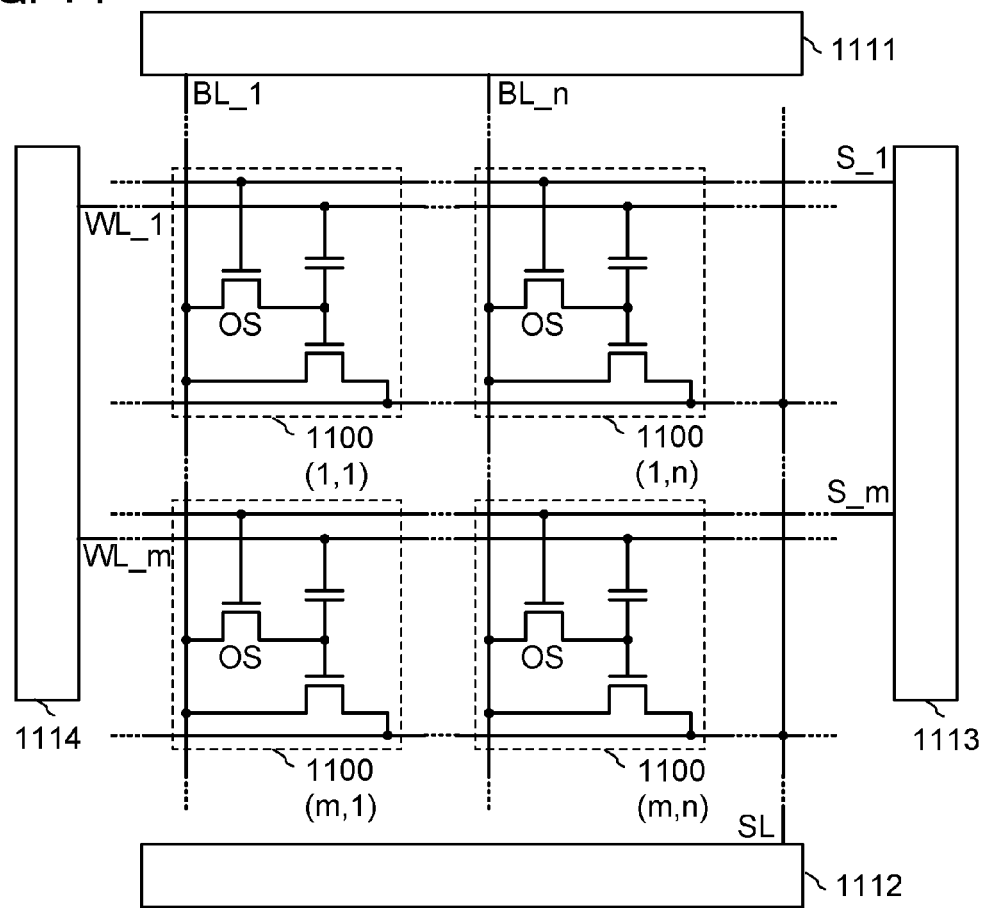
FIG. 14 is a circuit diagram of a semiconductor device.

FIG. 14 is an example of a circuit diagram of a semiconductor device having memory capacity of m×n bits.

The semiconductor device according to one embodiment of the present invention includes a memory cell array which includes m (m is an integer of 2 or more) signal lines S, m word lines WL, n (n is an integer of 2 or more) bit lines BL, k (k is a natural number of less than n) source lines SL, and memory cells 1100 (1, 1) to (m, n) arranged in a matrix of m rows (in the vertical direction)×n columns (in the horizontal direction); and peripheral circuits such as a first driver circuit 1111, a second driver circuit 1112, a third driver circuit 1113, and a fourth driver circuit 1114. Here, the structure described in the above embodiments (the structure in FIG. 13A) is applied to the memory cell 1100.

Each of the memory cells 1100 includes a first transistor, a second transistor, and a capacitor. In each of the memory cells 1100, a gate electrode of the first transistor, one of a source or drain electrodes of the second transistor, and one of electrodes of the capacitor are electrically connected to one another, and the source line SL and a source electrode (a source region) of the first transistor are electrically connected to each other. In addition, the bit line BL, the other of the source or drain electrodes of the second transistor, and a drain electrode of the first transistor are electrically connected to one another. The word line WL and the other of the electrodes of the capacitor are electrically connected to each other. The signal line S and a gate electrode of the second transistor are electrically connected to each other. In other words, the source line SL corresponds to the first wiring (the 1st line) in the structure illustrated in FIG. 13A, the bit line BL corresponds to the second wiring (the 2nd line) and the third wiring (the 3rd line), the signal line S corresponds to the fourth wiring (the 4th line), and the word line WL corresponds to the fifth wiring (the 5th line).

In the memory cell array illustrated in FIG. 14, the bit lines BL, the source lines SL, the word lines WL, and the signal lines S form a matrix. To one bit line BL, m memory cells 1100 arranged in one column are connected. In addition, n memory cells 1100 arranged in one row are connected to one word line WL and one signal line S. Further, the number of source lines SL is smaller than that of the bit lines BL; therefore, the source line SL needs to be connected to the memory cells 1100 connected to at least two bit lines BL. In other words, j (j is an integer greater than or equal to (m+1) and less than or equal to (m×n)) memory cells 1100 are connected to the source line SL. Note that it is preferable that the source line SL be arranged in a proportion of one to plural bit lines BL (i.e., (n/k) is an integer). In that case, if an equal number of the memory cells 1100 is connected to each source line SL, (m×n/k) memory cells 1100 are connected to each source line SL.

As in the memory cell array illustrated in FIG. 14, the source line SL which connects one memory cell 1100 to another memory cell is connected to the memory cells 1100 connected to at least two bit lines BL to make the number of source lines SL be smaller than that of bit lines BL, whereby the number of source lines can be made sufficiently small; thus, the degree of integration of the semiconductor device can be increased.

The bit lines BL are electrically connected to the first driver circuit 1111. The source lines SL are electrically connected to the second driver circuit 1112. The signal lines S are electrically connected to the third driver circuit 1113. The word lines WL are electrically connected to the fourth driver circuit 1114. Note that here, the first driver circuit 1111, the second driver circuit 1112, the third driver circuit 1113, and the fourth driver circuit 1114 are separately provided; however, the disclosed invention is not limited to this. A driver circuit having any one or some of the functions may alternatively be used.

Figure 15:
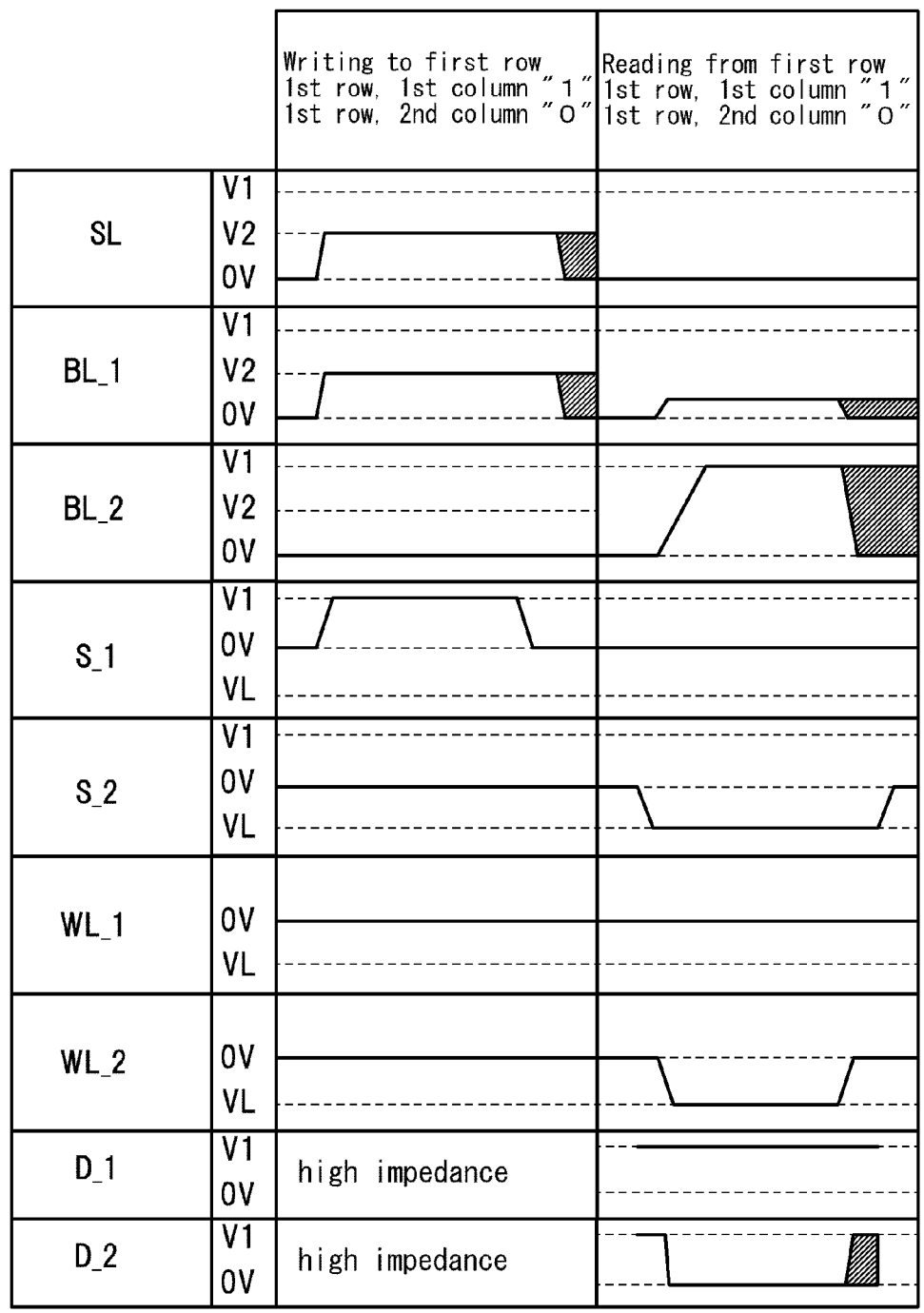
FIG. 15 is a timing diagram.

Next, writing operation and reading operation will be described. FIG. 15 is an example of a timing diagram of writing operation and reading operation of the semiconductor device illustrated in FIG. 14.

Although operation of a semiconductor device of a memory cell array of two rows and two columns will be described for simplification here, the disclosed invention is not limited to this.

Writing data to the memory cell 1100 (1,1) and the memory cell 1100 (1,2), which are in the first row and reading data from the memory cell 1100 (1,1) and the memory cell 1100 (1,2) will be described. Note that in the following description, the case where the data to be written to the memory cell (1,1) is "1" and data to be written to the memory cell (1,2) is "0."

Firstly, the writing operation will be described. A potential V1 is applied to the signal line S_1 in the first row, whereby the second transistors in the first row are turned on. Further, a potential of 0 V is applied to the signal line S_2 in the second row, whereby the second transistors in the second row are turned off.

Further, a potential V2 is applied to the bit line BL_1 in the first column and the potential of 0 V is applied to the bit line BL_2 in the second column.

Thus, the potential V2 is applied to a floating gate portion FG of the memory cell (1,1), and the potential of 0 V is applied to a floating gate portion FG of the memory cell (1,2). Here, the potential V2 is higher than the threshold value of the first transistor. Then, the potential of the signal line S_1 in the first row is set to 0 V, whereby the second transistors in the first row are turned off to finish writing. It is preferable that the potential V2 be substantially equal to the potential V1 or lower than or equal to the potential V1.

Note that the word line WL_1 in the first row and the word line WL_2 in the second row are at the potential of 0 V during the writing operation. At the end of the writing operation, before the potential of the bit line BL_1 in the first column is changed, the potential of the signal line S_1 in the first row is set to 0 V. After the writing operation, the threshold value of a memory cell is Vw0 in the case where data "0" has been written and Vw1 in the case where data "1" has been written. Here, the threshold value of the memory cell means the voltage of the terminal connected to the word line WL, which changes resistance between the source electrode and the drain electrode of the first transistor. Note that Vw0>0>Vw1 is satisfied here. In addition, the potential of the source line SL is set to V2, for example, which is the same as that of the bit line in the column where data "1" is written.

Secondly, the reading operation will be described. Here, the bit line BL is electrically connected to a read-out circuit illustrated in FIG. 16.

The potential 0 V and the potential VL are applied to the word line WL_1 in the first row and the word line WL_2 in the second row, respectively. The potential VL is lower than the threshold value Vw1. When the word line WL_1 is at the potential of 0 V, in the first row, the first transistor of the memory cell in which data "0" is held is turned off, and the first transistor of the memory cell in which data "1" is held is turned on. When the word line WL_2 is at the potential VL, in the second row, the first transistors of the memory cells in which either data "0" or data "1" is held are turned off.

As a result, the resistance between the bit line BL_1 and the source line SL is low because the first transistor in the memory cell (1,1) is on, and the resistance between the bit line BL_2 and the source line SL is high because the first transistor in the memory cell (1,2) is off. A read-out circuit connected to the bit line BL_1 and the bit line BL_2 can read data on the basis of a resistance of the bit line.

Note that, during the reading operation, the potential of 0 V and the potential VL are applied to the signal line S_1 and the signal line S2_2, respectively, whereby all the second transistors are off. The potential of the floating gate portions FG in the first row is 0 V or V2; thus, all the second transistors can be turned off by setting the potential of the signal line S_1 at 0 V. On the other hand, if the potential VL is applied to the word line WL_2, the potential of the floating gate portions FG in the second row become lower than the potential right after data writing. Therefore, in order to prevent the second transistors from turning on, the signal line S_2 is set to a low potential (the potential VL) which is the same as the potential of the word line WL_2. That is, the potentials of the signal line S and the word line WL in the row where data is not read are set to the same potential (the potential VL). Thus, all the second transistors can be turned off.

Figure 16:
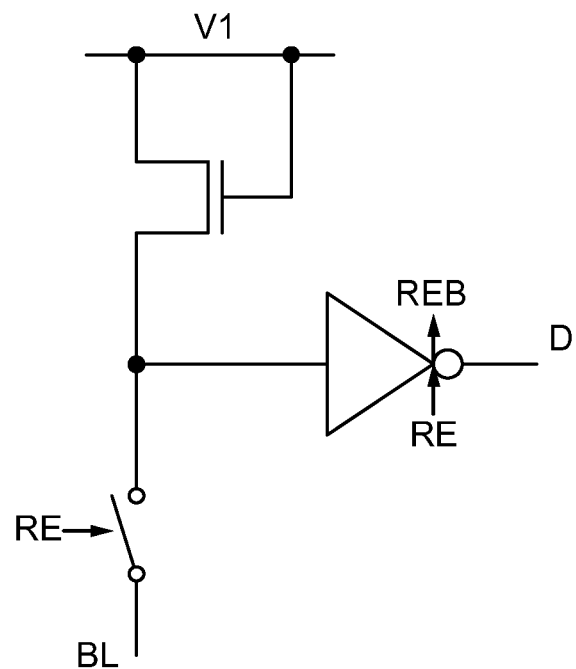
FIG. 16 is a circuit diagram of a semiconductor device.

Next, an output potential in the case where a circuit in FIG. 16 is used as a read-out circuit will be described. In the read-out circuit illustrated in FIG. 16, the bit line BL is connected to a clocked inverter and a transistor which is diode-connected to a wiring to which the potential V1 is applied, through a switching element controlled by a read enable signal (a RE signal). Further, a fixed potential (e.g., 0 V) is applied to the source line SL. Since the resistance between the bit line BL_1 and the source line SL is low, a low potential is applied to the clocked inverter and an output D_1 is high (V1). Since the resistance between the bit line BL_2 and the source line SL is low, a high potential is applied to the clocked inverter and the output D_2 is Low (0V).

The operation potentials can be set as follows, for example; V1=2 V, V2=1.5 V, VH=2 V, and VL=−2 V.

Figure 17:
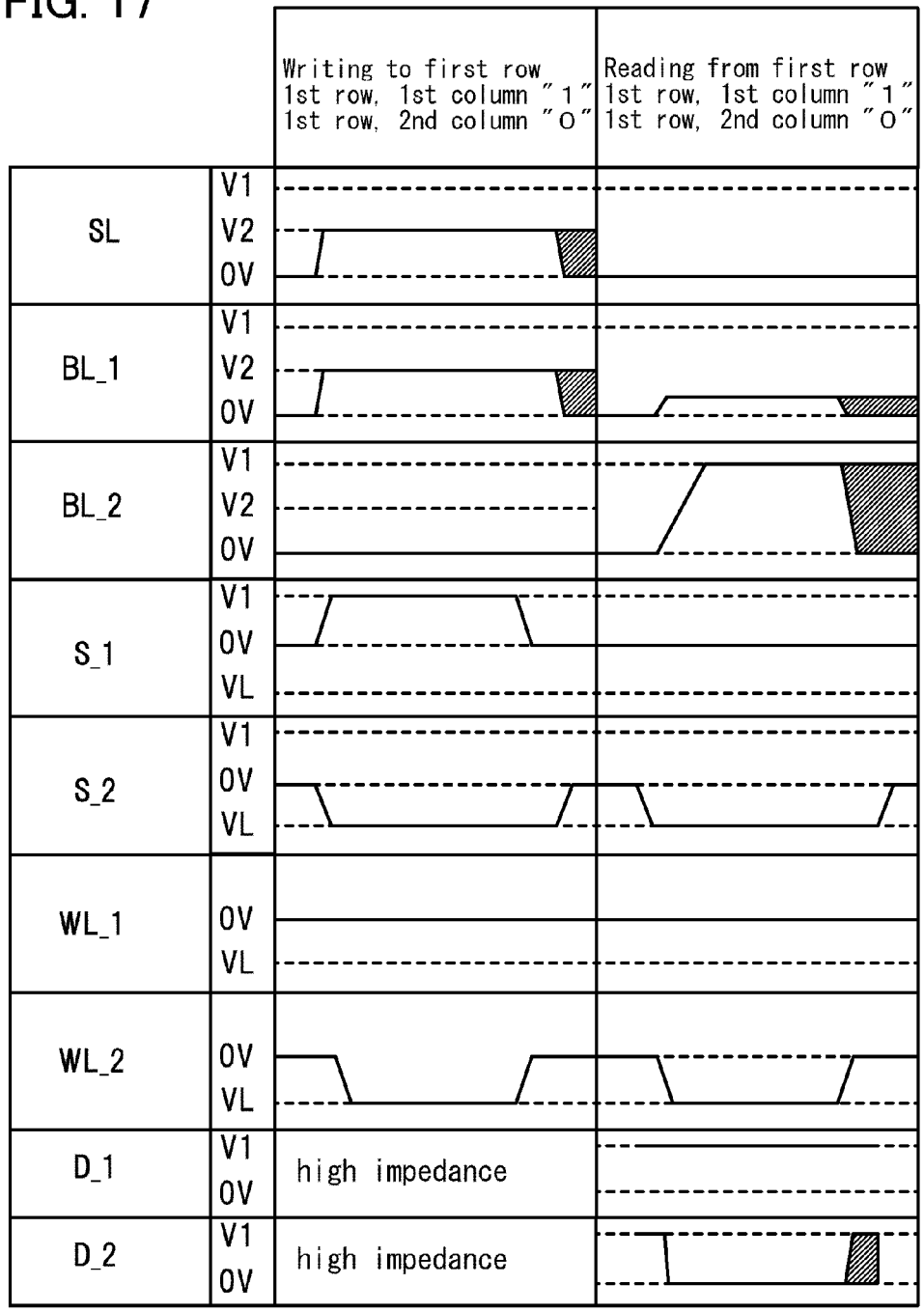
FIG. 17 is a timing diagram.

Next, writing operation which is different from the above writing operation will be described. The data to be written is the same as that in the above writing operation. FIG. 17 is an example of a timing diagram of the writing operation and reading operation.

In the writing operation based on the timing diagram of FIG. 15 (i.e., writing to the first row), the potential of the word line WL_2 at the time of writing is set to a potential of 0 V; thus, for example, in the case where data which has been written to the memory cell (2,1) or the memory cell (2,2) is data "1", steady-state current flows between the bit line BL_1 and the bit line BL_2. This is because at the time of the writing to the first row, the first transistor in the memory cells in the second row is turned on, whereby the bit line BL_1 and the bit line BL_2 are connected at low resistance through the source line. In the writing operation illustrated in FIG. 17, such steady-state current is less likely to be generated.

The potential V1 is applied to the signal line S_1 of the first row, whereby the second transistors in the first row are turned on. Further, the potential VL is applied to the signal line S_2 of the second row, whereby the second transistors in the second row are turned off.

Further, a potential V2 is applied to the bit line BL_1 in the first column and the potential of 0 V is applied to the bit line BL_2 in the second column.

Thus, the potential V2 is applied to the floating gate portion FG of the memory cell (1,1), and the potential of 0 V is applied to the floating gate portion FG of the memory cell (1,2). Here, the potential V2 is higher than the threshold value of the first transistor. Then, the potential of the first signal line S_1 in the first row is set to 0 V, whereby the second transistors in the first row are turned off to finish writing.

Note that the word line WL_1 in the first row and the word line WL_2 in the second row are at the potential of 0 V and the potential of VL, respectively, during the writing operation. When the word line WL_2 in the second row is at the potential VL, in the second row, the first transistors of the memory cells in which either data "0" or data "1" is held are turned off. The potential V2 is applied to the source line SL during the writing operation. In the case where written data in all the memory cells are data "0", the potential of 0 V may be applied to the source line.

At the end of the writing operation, before the potential of the bit line BL_1 in the first column is changed, the potential of the signal line S_1 in the first row is set to 0 V. After the writing operation, the threshold value of a memory cell is Vw0 in the case where data "0" has been written and Vw1 in the case where data "1" has been written. Here, Vw0>0>Vw1 is satisfied.

In the writing operation, the first transistors in the memory cells in the row to which data is not written (in this case, the second row) are off. Thus, only the row to which data is written has a problem of steady-state current between the bit line and the source line. In the case where data "0" is written to the memory cell of the row to which data is written, the first transistor in the memory cell is off; thus, a problem of steady-state current does not occur. On the other hand, in the case where data "1" is written to the memory cell of the row to which data is written, the first transistor in the memory cell is on; thus, steady-state current occurs if there is a potential difference between the source line SL and the bit line BL (in this case, the bit line BL_1). The potential of the source line SL is thus made to be equal to the potential V2 of the bit line BL_1, whereby steady-state current between the bit line and the source line can be prevented.

As described above, generation of steady-state current at the time of the writing operation can be prevented in the writing operation. In other words, power consumed at the time of the writing operation can be sufficiently reduced in the writing operation.

Note that the reading operation is performed in a manner similar to that of the above reading operation.

A semiconductor device including an oxide semiconductor, whose off-state current is extremely low, is used as the semiconductor device in FIG. 14, whereby stored data can be held for an extremely long period. In other words, refresh operation becomes unnecessary or the frequency of the refresh operation can be extremely low, which leads to a sufficient reduction in power consumption. Moreover, stored data can be held for a long period even when power is not supplied.

Further, the semiconductor device in FIG. 14 does not need high voltage for writing data, and degradation of the element does not become a problem. Thus, the semiconductor device in FIG. 14 does not have a limit on the number of times of rewriting, which has been a problem of a conventional non-volatile memory, and thus has significantly improved reliability. Furthermore, since data is written by turning on or off the transistor, high-speed operation can be easily realized. Additionally, there is an advantage in that operation for erasing data is not needed.

Since a transistor including a material which is not an oxide semiconductor can operate at sufficiently high speed, when it is combined with a transistor including an oxide semiconductor, a semiconductor device can perform operation (e.g., reading data) at sufficiently high speed. Further, with a transistor including a material which is not an oxide semiconductor, a variety of circuits (e.g., a logic circuit or a driver circuit) which needs to operate at high speed can be suitably realized.

A semiconductor device includes both the transistor including a material which is not an oxide semiconductor and the transistor including an oxide semiconductor, whereby the semiconductor device can have novel features.

Furthermore, in the semiconductor device illustrated in FIG. 14, the number of wirings per memory cell can be reduced. Accordingly, the area of memory cells can be reduced and the storage capacity per unit area of the semiconductor device can be increased.

The structures, methods, and the like described in this embodiment can be combined as appropriate with any of the structures and methods described in the other embodiments.

Embodiment 6

In this embodiment, the cases where the semiconductor device described in the above embodiments is applied to an electronic device will be described with reference to FIGS. 18A to 18F. In this embodiment, the case where the above semiconductor device is applied to an electronic device such as a computer, a mobile phone (also referred to as a mobile telephone or a mobile telephone device), a portable information terminal (including a portable game console, an audio player, and the like), a digital camera, a digital video camera, an electronic paper, or a television device (also referred to as a television or a television receiver) will be described.

Figure 18A:
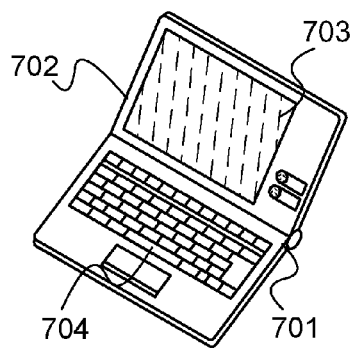
FIGS. 18A to 18F illustrate electronic devices each including a semiconductor device.

FIG. 18A illustrates a notebook personal computer including a housing 701, a housing 702, a display portion 703, a keyboard 704, and the like. At least one of the housing 701 and the housing 702 is provided with the semiconductor device described in the above embodiments. Consequently, a notebook personal computer with sufficiently low power consumption, in which writing and reading of data can be performed at high speed and data can be held for a long time, can be realized.

Figure 18D:
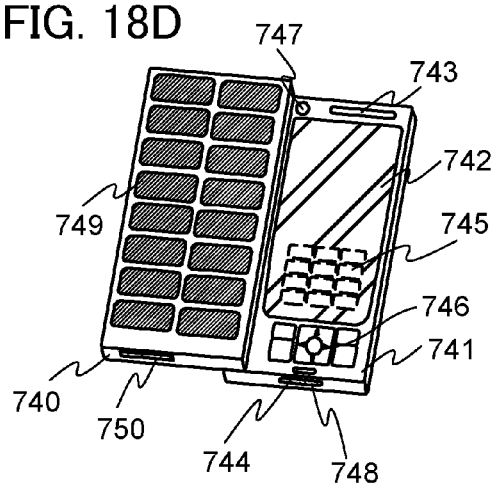
Figure 18B:
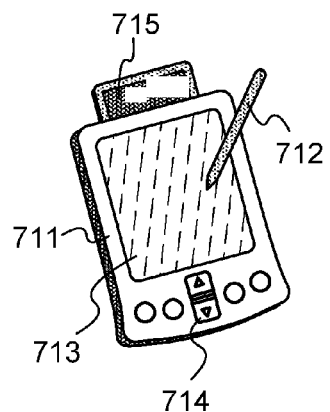

FIG. 18B illustrates a portable information terminal (personal digital assistance (PDA)). A main body 711 is provided with a display portion 713, an external interface 715, operation buttons 714, and the like. Further, a stylus 712 for operating the portable information terminal or the like is also provided. The semiconductor device described in the above embodiments is provided in the main body 711. Consequently, a portable information terminal with sufficiently low power consumption, in which writing and reading of data can be performed at high speed and data can be held for a long time, can be realized.

Figure 18E:
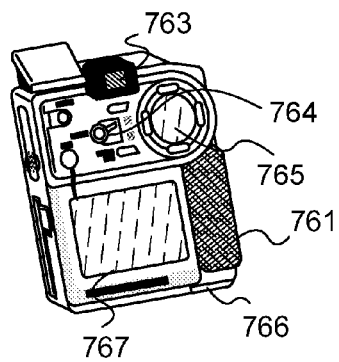
Figure 18C:
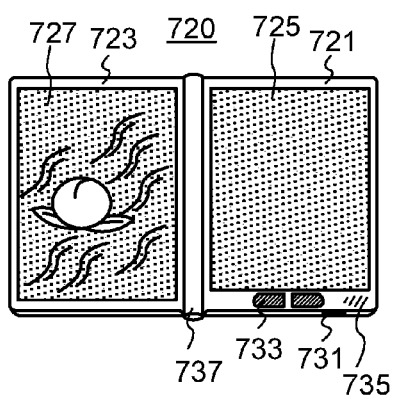

FIG. 18C illustrates an e-book reader 720 mounting an electronic paper. The e-book reader has two housings, a housing 721 and a housing 723. The housing 721 and the housing 723 are provided with a display portion 725 and a display portion 727, respectively. The housing 721 and the housing 723 are connected by a hinge 737 and can be opened and closed along the hinge 737. Further, the housing 721 is provided with a power switch 731, operation keys 733, a speaker 735, and the like. Consequently, an e-book reader with sufficiently low power consumption, in which writing and reading of data can be performed at high speed and data can be held for a long time, can be realized.

FIG. 18D illustrates a mobile phone including two housings, a housing 740 and a housing 741. Further, the housing 740 and the housing 741 which are in a state where they are opened as illustrated in FIG. 18D can be slid so that one is lapped over the other and the size of the mobile phone can be reduced, which makes the mobile phone suitable for being carried. The housing 741 is provided with a display panel 742, a speaker 743, a microphone 744, an operation key 745, a pointing device 746, a camera lens 747, an external connection terminal 748, and the like. The housing 740 is provided with a solar cell 749 that charges the mobile phone, an external memory slot 750, and the like. In addition, an antenna is incorporated in the housing 741. At least one of the housing 740 and the housing 741 is provided with the semiconductor device described in the above embodiments. Consequently, a mobile phone with sufficiently low power consumption, in which writing and reading of data can be performed at high speed and data can be held for a long time, can be realized.

FIG. 18E illustrates a digital camera including a main body 761, a display portion 767, an eyepiece 763, an operation switch 764, a display portion 765, a battery 766, and the like. The semiconductor device described in the above embodiments is provided in the main body 761. Consequently, a digital camera with sufficiently low power consumption, in which writing and reading of data can be performed at high speed and data can be held for a long time, can be realized.

Figure 18F:
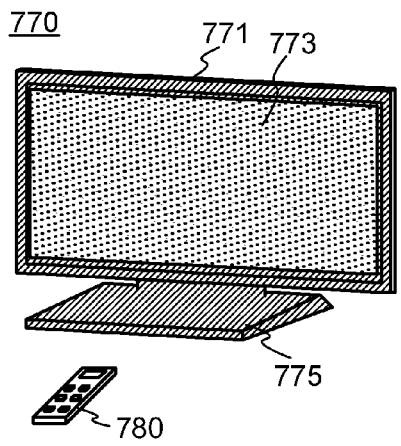

FIG. 18F illustrates a television device 770 including a housing 771, a display portion 773, a stand 775, and the like. The television device 770 can be operated by an operation switch of the housing 771 or a remote control 780. The semiconductor device described in the above embodiments is mounted in the housing 771 and the remote control 780. Consequently, a television device with sufficiently low power consumption, in which writing and reading of data can be performed at high speed and data can be held for a long time, can be realized.

Thus, the semiconductor device according to the above embodiments is mounted in the electronic devices described in this embodiment. Accordingly, electronic devices with low power consumption can be realized.

This application is based on Japanese Patent Application serial no. 2010-064900 filed with Japan Patent Office on Mar. 19, 2010, the entire contents of which are hereby incorporated by reference.

EXPLANATION OF REFERENCE

100: substrate, 102: protective layer, 104: semiconductor region, 106: element isolation insulating layer, 108: gate insulating layer, 110: gate electrode, 116: channel formation region, 120: impurity region, 122: metal layer, 124: metal compound region, 126: electrode, 128: insulating layer, 142a: source or drain electrode, 142b: source or drain electrode, 144: oxide semiconductor layer, 146: gate insulating layer, 148a: gate electrode, 149a: electrode, 150: insulating layer, 151: insulating layer, 152: insulating layer, 153: opening, 154: electrode, 156: wiring, 160: transistor, 162: transistor, 164: capacitor, 242a: source or drain electrode, 242b: source or drain electrode, 243: insulating layer, 243a: insulating layer, 244: oxide semiconductor layer, 246: gate insulating layer, 248a: gate electrode, 249a: electrode, 250: insulating layer, 251: insulating layer, 252: insulating layer, 262: transistor, 264: capacitor, 500: base substrate, 502: nitrogen-containing layer, 510: single crystal semiconductor substrate, 512: oxide film, 514: embrittled region, 516: single crystal semiconductor layer, 518: single crystal semiconductor layer, 520: semiconductor layer, 522: insulating layer, 522a: gate insulating layer, 524: conductive layer, 524a: gate electrode, 526: channel formation region, 528: impurity region, 530: electrode, 534: insulating layer, 542a: source or drain electrode, 542b: source or drain electrode, 544: oxide semiconductor layer, 546: gate insulating layer, 548a: gate electrode, 549a: electrode, 550: insulating layer, 551: insulating layer, 552: insulating layer, 554: electrode, 556: wiring, 560: transistor, 562: transistor, 564: capacitor, 701: housing, 702: housing, 703: display portion, 704: keyboard, 711: main body, 712: stylus, 713: display portion, 714: operation button, 715: external interface, 720: e-book reader, 721: housing, 723: housing, 725: display portion, 727: display portion, 731: power switch, 733: operation key, 735: speaker, 737: hinge, 740: housing, 741: housing, 742: display panel, 743: speaker, 744: microphone, 745: operation key, 746: pointing device, 747: camera lens, 748: external connection terminal, 749:

solar cell, 750: external memory slot, 761: main body, 763: eyepiece, 764: operation switch, 765: display portion, 766: battery, 767: display portion, 770: television device, 771: housing, 773: display portion, 775: stand, 780: remote control, 1100: memory cell, 1111: driver circuit, 1112: driver circuit, 1113: driver circuit, 1114: driver circuit.

The invention claimed is:

1. A semiconductor device comprising:
a memory cell comprising:
   a first transistor comprising:
      a first channel formation region;
      a first gate insulating layer over the first channel formation region; and
      a first gate electrode over the first gate insulating layer, the first gate electrode overlapping with the first channel formation region;
   a second transistor over the first transistor, the second transistor comprising:
      a second channel formation region;
      a first electrode electrically connected to the second channel formation region;
      a second gate electrode overlapping with the second channel formation region; and
      a second gate insulating layer between the second channel formation region and the second gate electrode;
   an insulating layer over the second transistor; and
   a second electrode over the insulating layer, the second electrode overlapping with the first electrode,
wherein the first channel formation region and the second channel formation region comprise different semiconductor materials,
wherein the first gate electrode is electrically connected to the first electrode, and
wherein the first electrode overlaps with the first gate electrode.

2. The semiconductor device according to claim 1, wherein the second electrode overlaps with at least part of the second gate electrode with the insulating layer between the second electrode and the second gate electrode.

3. The semiconductor device according to claim 1, wherein the second electrode overlaps with at least part of the first gate electrode.

4. The semiconductor device according to claim 1, wherein the first transistor comprises impurity regions between which the first channel formation region is sandwiched.

5. The semiconductor device according to claim 1, wherein the first channel formation region is formed in a single crystal silicon substrate.

6. The semiconductor device according to claim 1, wherein the first channel formation region is formed in a semiconductor film over a substrate.

7. The semiconductor device according to claim 1, wherein the second channel formation region of the second transistor comprises an oxide semiconductor.

8. A semiconductor device comprising:
a memory cell comprising:
   a first channel formation region;
   a first gate insulating layer over the first channel formation region;
   a first gate electrode over the first gate insulating layer, the first gate electrode overlapping with the first channel formation region;
   a first electrode over the first gate electrode;
   a first semiconductor layer over the first electrode, the first semiconductor layer comprising a second channel formation region;
   a second gate insulating layer over the first semiconductor layer;
   a second gate electrode over the second gate insulating layer, the second gate electrode overlapping with the second channel formation region;
   an insulating layer over the second gate electrode; and
   a second electrode over the insulating layer, the second electrode overlapping with the first electrode.

9. The semiconductor device according to claim 8, wherein the second electrode overlaps with at least part of the second gate electrode with the insulating layer between the second electrode and the second gate electrode.

10. The semiconductor device according to claim 8, wherein the second electrode overlaps with at least part of the first gate electrode.

11. The semiconductor device according to claim 8, wherein the first channel formation region is formed in a single crystal silicon substrate.

12. The semiconductor device according to claim 8, wherein the first channel formation region is formed in a semiconductor film over a substrate.

13. The semiconductor device according to claim 8, wherein the second channel formation region comprises an oxide semiconductor.

* * * * *